(12) United States Patent
Ware et al.

(10) Patent No.: US 11,450,356 B2
(45) Date of Patent: Sep. 20, 2022

(54) SYNCHRONOUS SIGNALING INTERFACE WITH OVER-CLOCKED TIMING REFERENCE

(71) Applicant: Rambus Inc., Sunnyvale, CA (US)

(72) Inventors: Frederick A. Ware, Los Altos Hills, CA (US); John Eric Linstadt, Palo Alto, CA (US); Carl W. Werner, Los Gatos, CA (US)

(73) Assignee: Rambus Inc., San Jose, CA (US)

( * ) Notice: Subject to any disclaimer, the term of this patent is extended or adjusted under 35 U.S.C. 154(b) by 76 days.

(21) Appl. No.: 16/828,591

(22) Filed: Mar. 24, 2020

(65) Prior Publication Data

US 2020/0294557 A1    Sep. 17, 2020

Related U.S. Application Data

(63) Continuation of application No. 15/779,977, filed as application No. PCT/US2016/064484 on Dec. 1, 2016, now Pat. No. 10,622,032.

(60) Provisional application No. 62/335,452, filed on May 12, 2016, provisional application No. 62/264,664, filed on Dec. 8, 2015.

(51) Int. Cl.
| G11C 7/04 | (2006.01) |
| G06F 1/12 | (2006.01) |
| G11C 7/22 | (2006.01) |
| G11C 29/02 | (2006.01) |
| G11C 29/50 | (2006.01) |
| H03K 5/15 | (2006.01) |
| H01L 39/22 | (2006.01) |

(52) U.S. Cl.
CPC ............ *G11C 7/04* (2013.01); *G06F 1/12* (2013.01); *G11C 7/222* (2013.01); *G11C 29/022* (2013.01); *G11C 29/023* (2013.01); *G11C 29/50012* (2013.01); *G11C 2207/2254* (2013.01); *H01L 39/223* (2013.01); *H03K 5/15* (2013.01)

(58) Field of Classification Search
CPC ...................................................... G11C 7/04
See application file for complete search history.

(56) References Cited

U.S. PATENT DOCUMENTS 6,321,282 B1    11/2001  Horowitz et al.
6,476,738 B1 *  11/2002  Mitsutani .......... H03M 13/2703
                                                     341/100

(Continued)

OTHER PUBLICATIONS

Kirichenko, D.E. et al., "Zero Static Power Dissipation Biasing of RSFQ Circuits", IEEE Transactions on Applied Superconductivity, vol. 21, No. 3, pp. 776-779, Jun. 2011. 4 pages.

(Continued)

*Primary Examiner* — Douglas King
(74) *Attorney, Agent, or Firm* — Charles Shemwell

(57) ABSTRACT

In a chip-to-chip signaling system includes at least one signaling link coupled between first and second ICs, the first IC has an interface coupled to the signaling link and timed by a first interface timing signal. The second IC has an interface coupled to the signaling link and timed by a second interface timing signal that is mesochronous with respect to the first interface timing signal. The second IC further has phase adjustment circuitry that adjusts a phase of the second interface timing signal using a digital counter implemented with Josephson-junction circuit elements.

20 Claims, 8 Drawing Sheets

(56) References Cited

U.S. PATENT DOCUMENTS

| | | |
|---|---|---|
| 6,643,787 B1 | 11/2003 | Zerbe et al. |
| 6,675,272 B2 | 1/2004 | Ware et al. |
| 6,873,939 B1 | 3/2005 | Zerbe et al. |
| 6,961,862 B2 | 11/2005 | Best et al. |
| 7,068,071 B1 | 6/2006 | Milne et al. |
| 7,095,789 B2 | 8/2006 | Ware et al. |
| 7,301,831 B2 | 11/2007 | Ware |
| 7,400,670 B2 | 7/2008 | Hampel et al. |
| 7,516,029 B2 | 4/2009 | Kim et al. |
| 7,668,276 B2 | 2/2010 | Hampel et al. |
| 8,270,209 B2 | 9/2012 | Herr et al. |
| 8,270,501 B2 | 9/2012 | Best |
| 8,589,717 B1 * | 11/2013 | Davis ................. G06F 1/04 713/500 |
| 8,737,162 B2 | 5/2014 | Ware et al. |
| 9,071,407 B2 | 6/2015 | Chandrasekaran et al. |
| 10,038,450 B1 | 7/2018 | Cory |
| 2005/0138328 A1 | 6/2005 | Moy et al. |
| 2008/0049885 A1 | 2/2008 | Inamdar |
| 2011/0235459 A1 | 9/2011 | Ware et al. |
| 2011/0273215 A1 | 11/2011 | Gupta |
| 2013/0187696 A1 | 7/2013 | Krishna et al. |

OTHER PUBLICATIONS

Likharev, K.K. et al., "RSFQ Logic/Memory Family: A New Josephson-Junction Technology for Sub-Terahertz-Clock-Frequency Digital Systems", IEEE Transactions on Applied Superconductivity, vol. 1, No. 1, pp. 3-28, Mar. 1991. 26 pages.

Notification Concerning Transmittal of International Preliminary Report on Patentability dated Jun. 21, 2018 re: Int'l Appln. No. PCT/US16/064484. 7 Pages.

Notification of Transmittal of the International Search Report and the Written Opinion of the International Searching Authority dated Feb. 21, 2017 re: Int'l Appln. No. PCT/US16/064484. 12 Pages.

Woo, Dong Hyuk et al., "Pragmatic Integration of an SRAM Row Cache in Heterogeneous 3-D DRAM Architecture Using TSV", IEEE Transactions on Very Large Scale Integration (VLSI) Systems, vol. 21, No. 1, pp. 1-13, Jan. 2013. 13 pages.

* cited by examiner

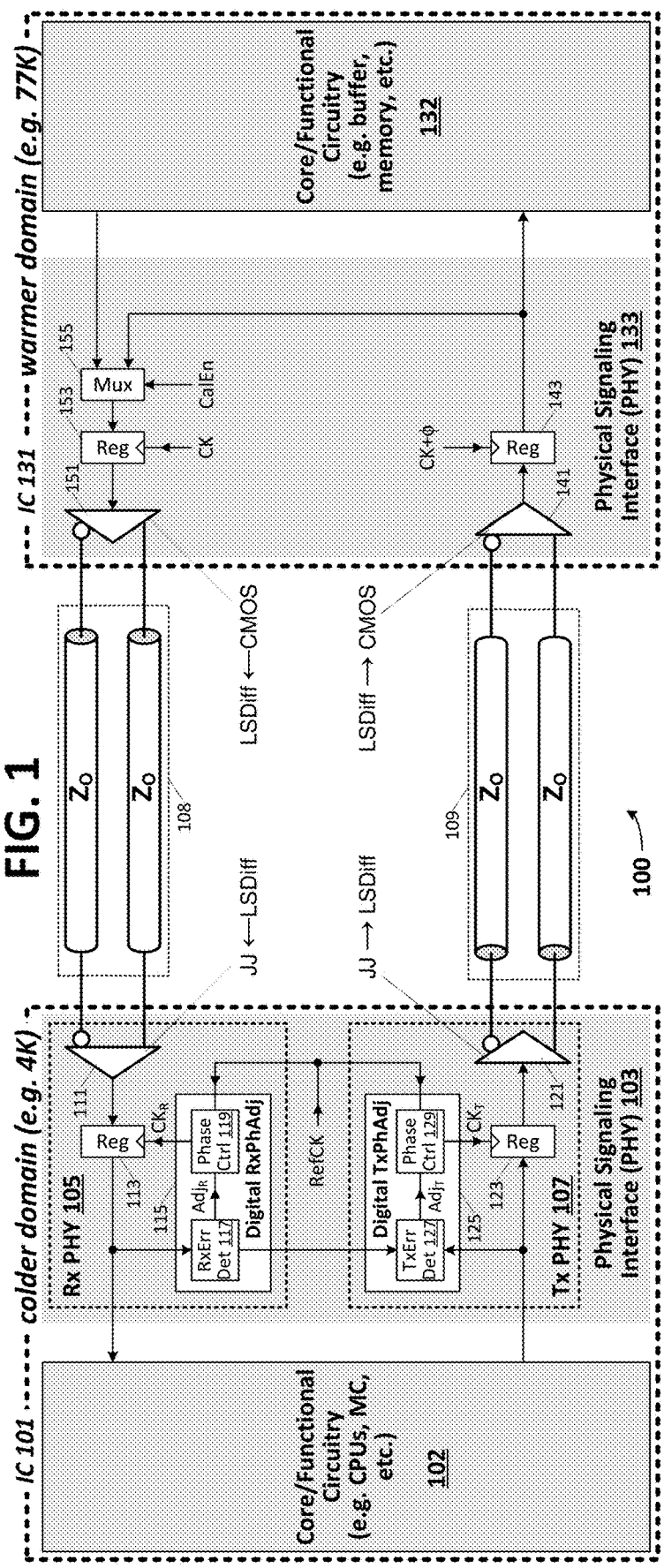
FIG. 1
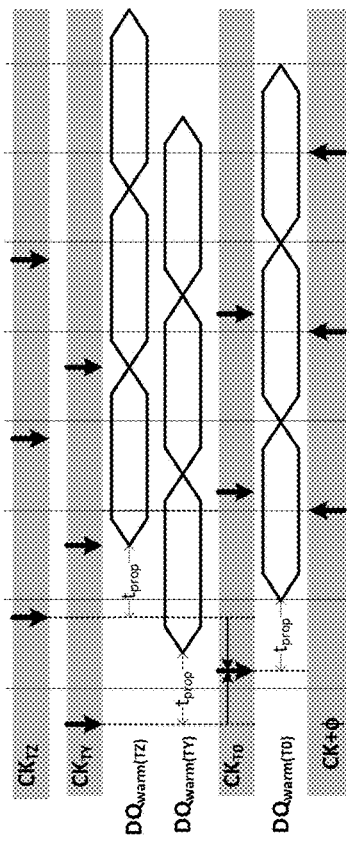
FIG. 2B Cold-Side Transmit Timing Calibration
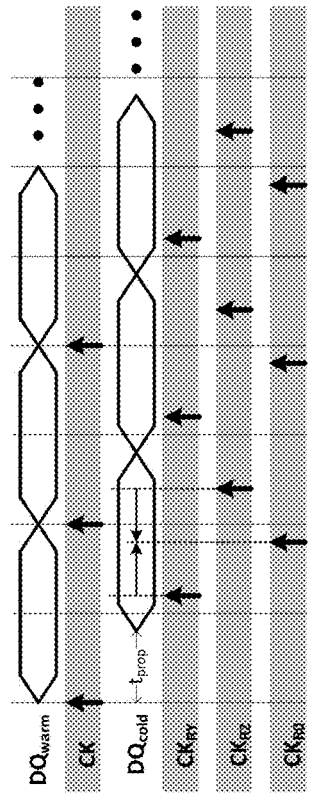
FIG. 2A Cold-Side Receive Timing Calibration

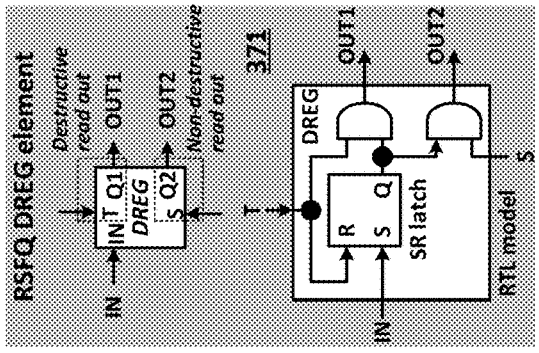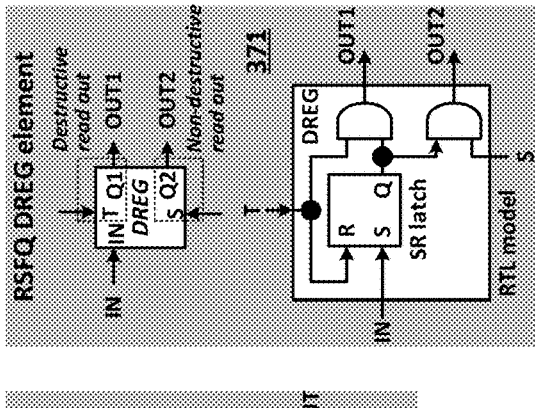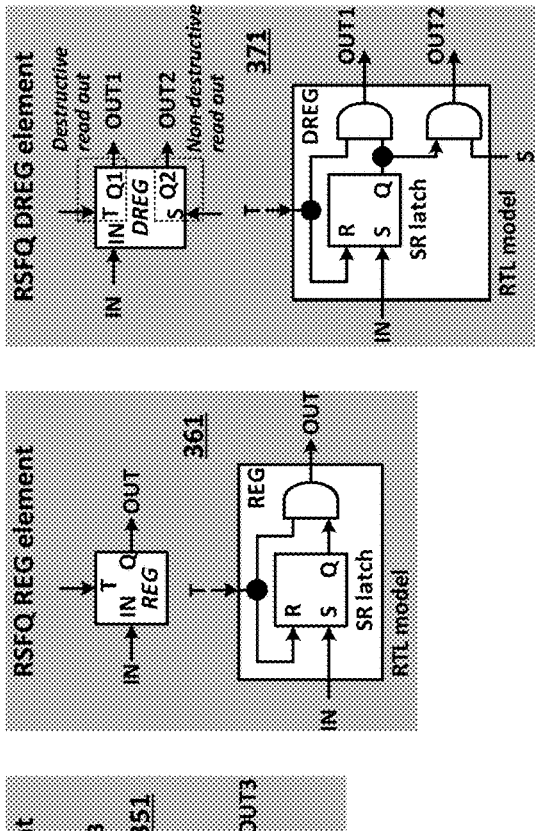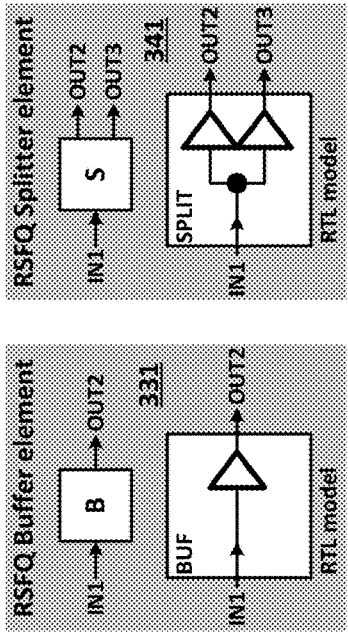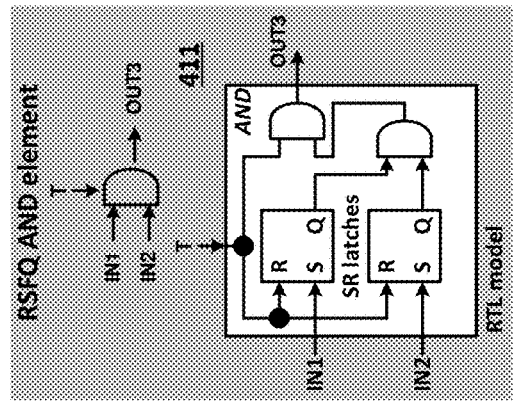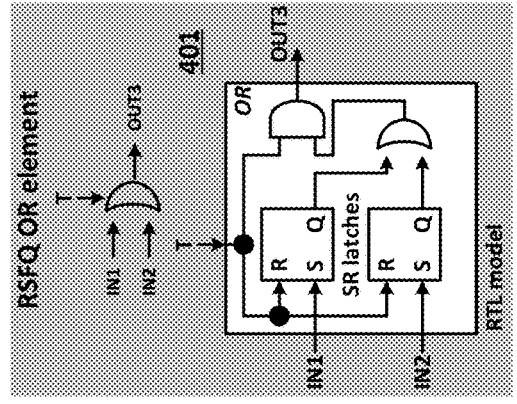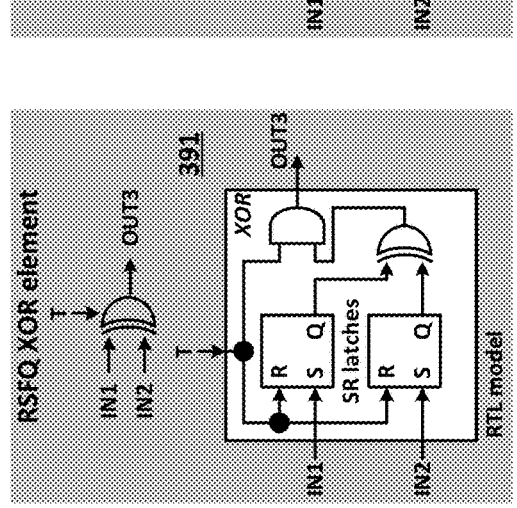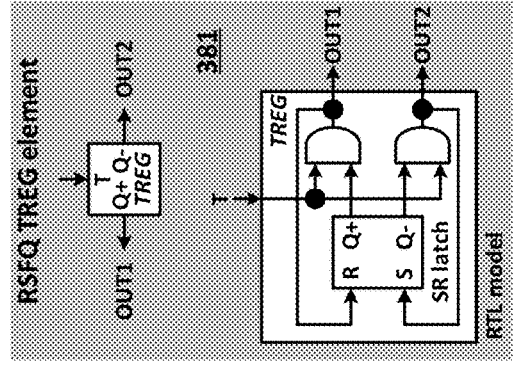

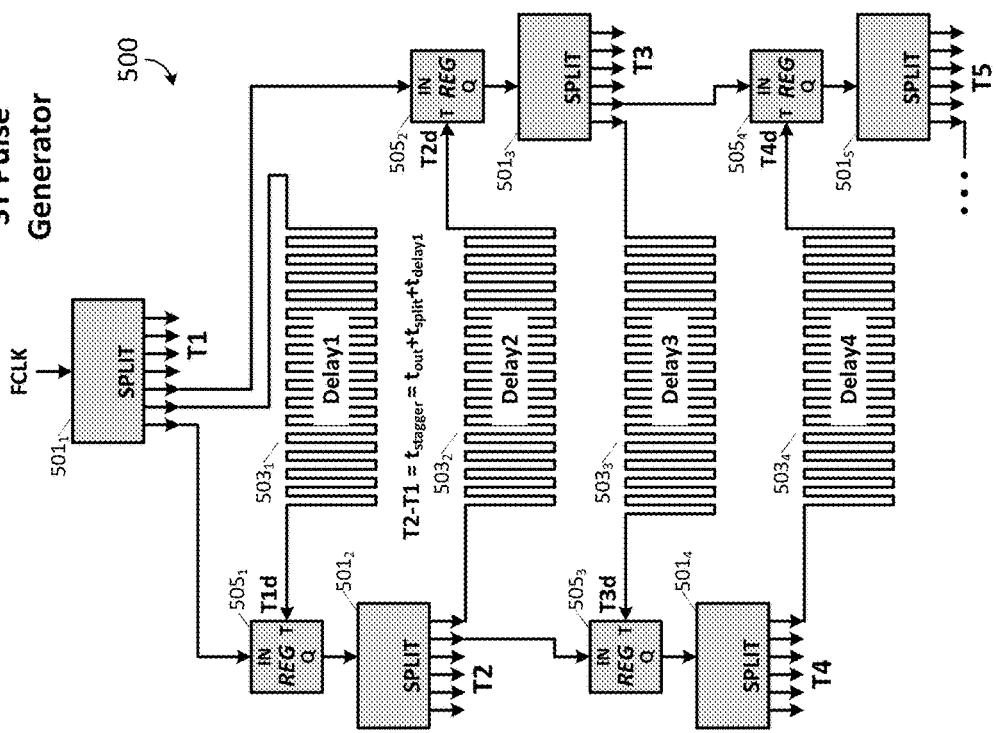
FIG. 12
ST Pulse Generator
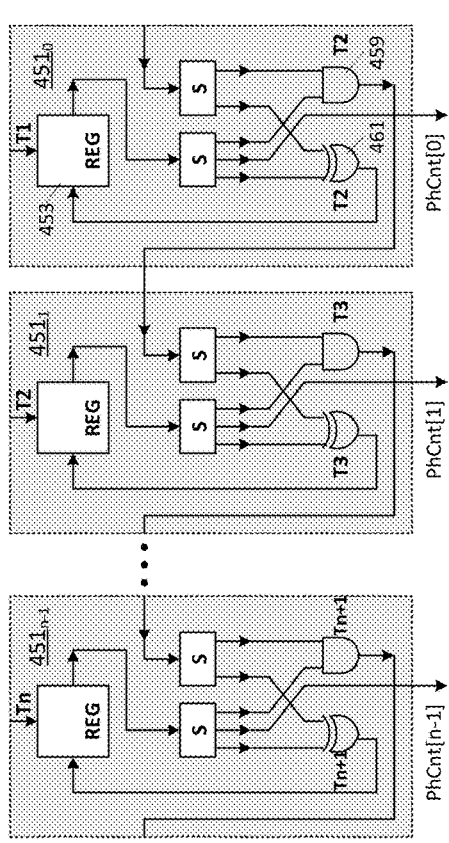
FIG. 9
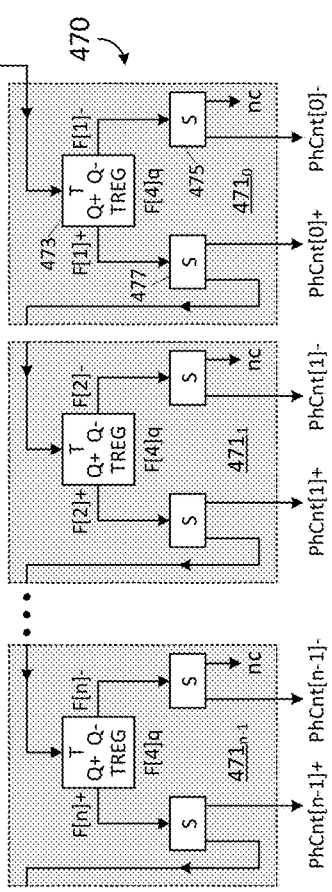
FIG. 10
FIG. 11

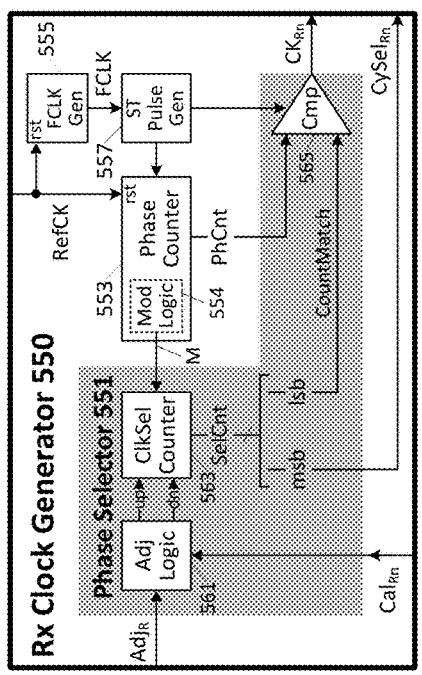
FIG. 13
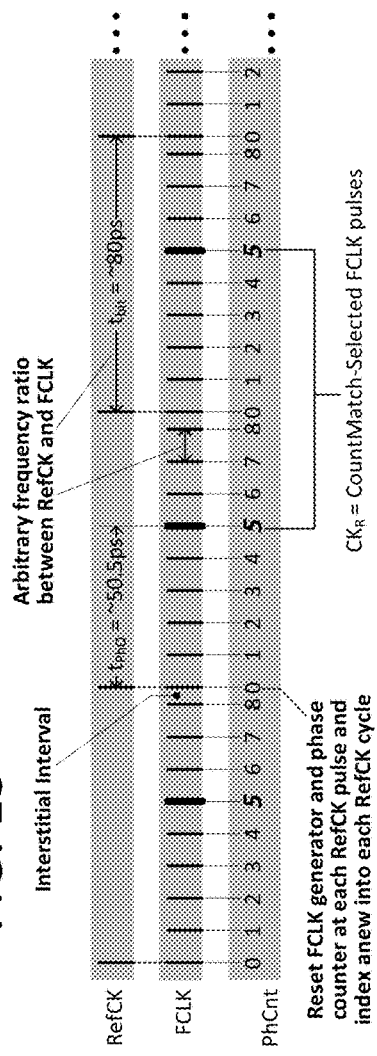
FIG. 14
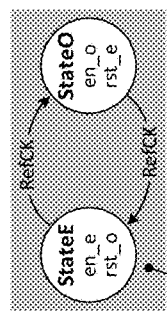
FIG. 16
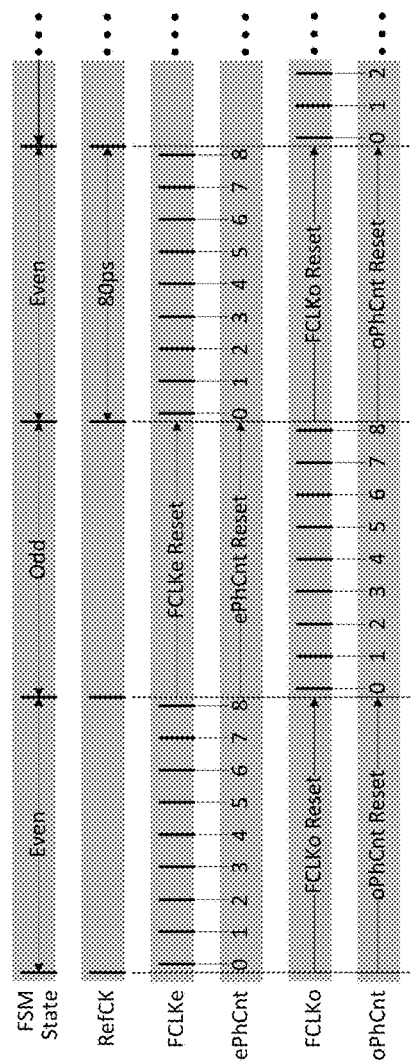
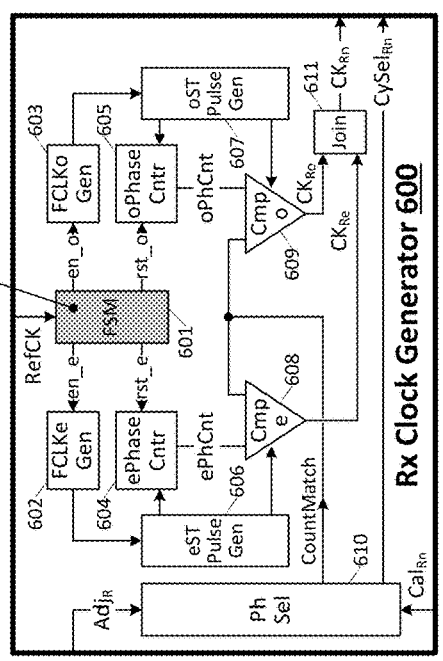
FIG. 15

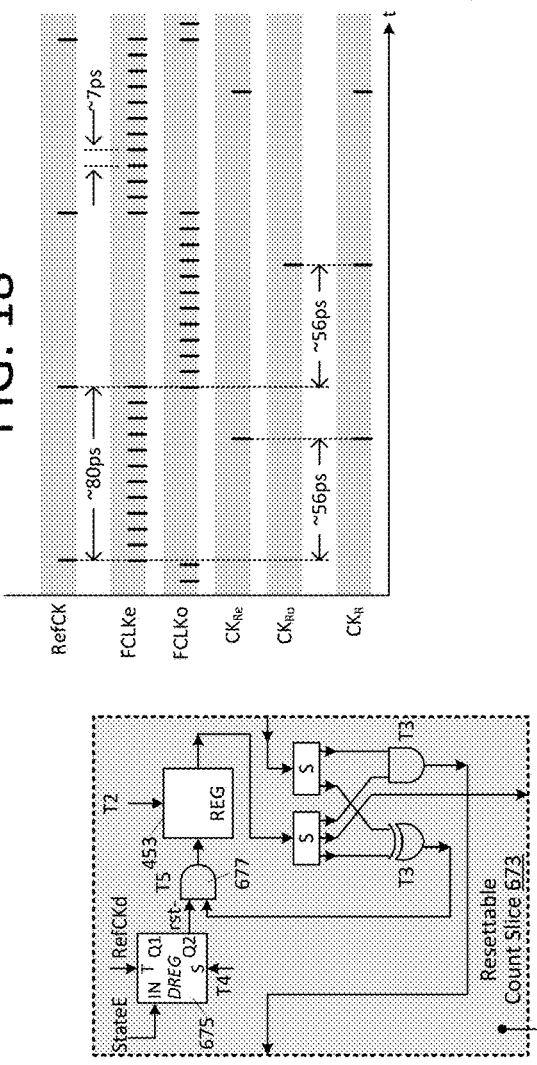
FIG. 17
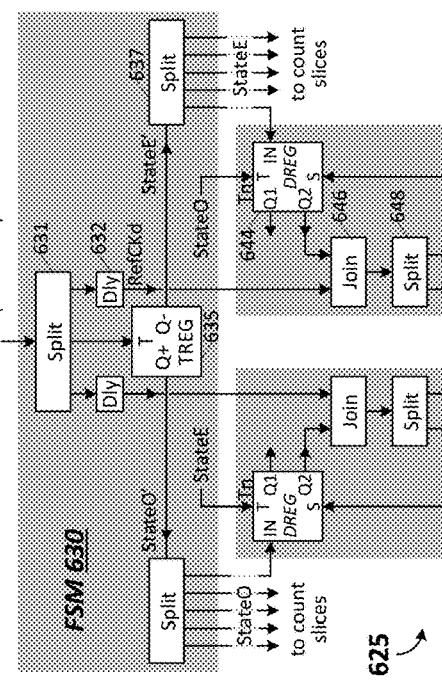
FIG. 18
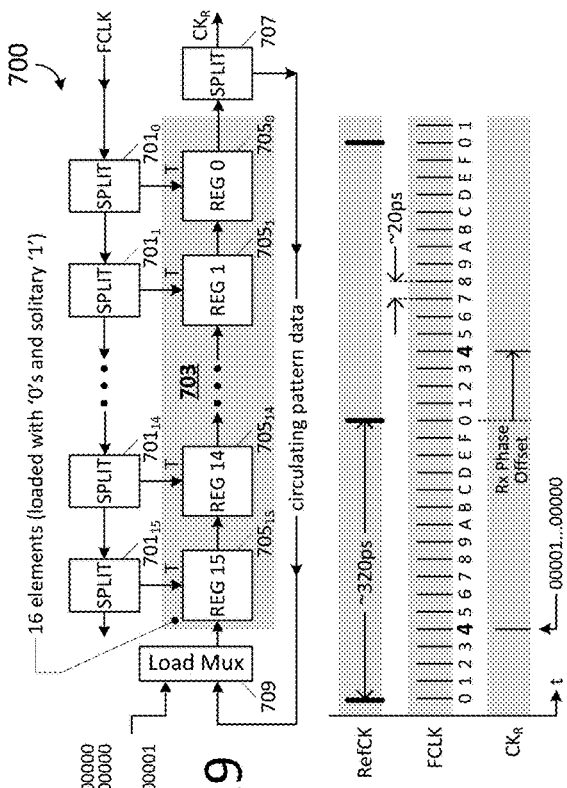
FIG. 19
FIG. 20

SYNCHRONOUS SIGNALING INTERFACE WITH OVER-CLOCKED TIMING REFERENCE

TECHNICAL FIELD

The present disclosure relates to high-speed signaling between integrated circuit devices.

DRAWINGS

The various embodiments disclosed herein are illustrated by way of example, and not by way of limitation, in the figures of the accompanying drawings and in which like reference numerals refer to similar elements and in which:

FIG. 1 illustrates a signaling system embodiment in which constituent integrated circuit devices (IC's) signal one another from disparate temperature domains and in which an overclocked timing reference is used to enable purely digital signal timing adjustment;

FIGS. 2A and 2B illustrate exemplary receive and transmit timing calibration operations that may be carried out to identify receive and transmit boundary clock phases, respectively;

FIGS. 7A-7I and FIG. 8 illustrate operation and resistor-transistor-logic models of various RSFQ circuit elements shown in FIG. 6 and other embodiments described herein;

FIGS. 9 and 10 illustrate alternative phase counter embodiments having shortened critical feedback paths between phase-count register output and input to permit higher fast-clock (FCLK) frequencies and correspondingly higher signaling rates;

FIG. 11 illustrates exemplary per-bit count-match circuitry that generates a set of match bits for the toggle counter slices shown in FIG. 10;

FIG. 12 illustrates an exemplary self-timing pulse generator that may be used to generate self-timing pulses (T1, T2, . . . ) in any of the self-timed RSFQ logic circuit embodiments herein;

FIG. 13 illustrates a plesiochronous receive/transmit timing approach that permits a fast clock signal (FCLK) to have an arbitrary (including non-integer) frequency ratio with respect to a data-rate reference clock signal (RefCK);

FIG. 14 illustrates an embodiment of a receive clock generator that enables generation of a receive timing signal having a digitally controlled phase offset relative to RefCK despite a plesiochronous relationship between FCLK and RefCK;

Figure 4:
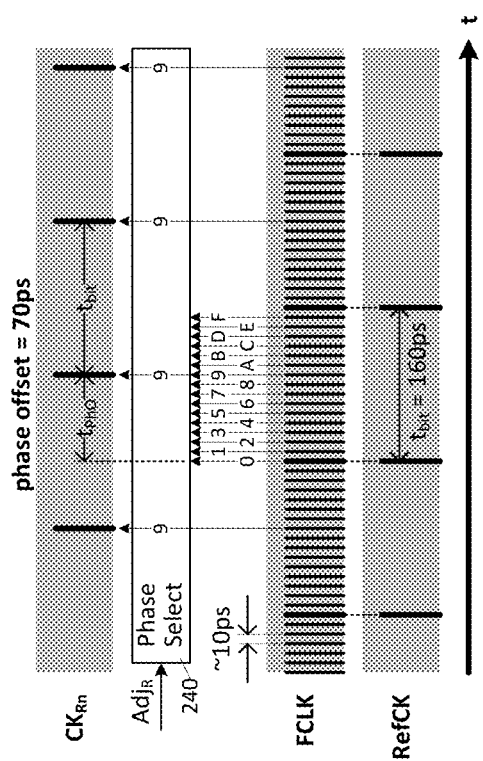
FIG. 4 illustrates an exemplary phase adjustment/selection operation that may be carried out within any one of the receive clock generators shown in FIG. 3 to generate respective receive clock signals.

FIGS. 15, 16, 17 and 18 illustrate embodiments of digital phase adjusters that avoid a reset-timing pinch by providing dual fast-clock generators and phase counters and activating an alternate fast-clock generator/phase counter pair from one RefCK period to the next; and FIGS. 19 and 20 correspond to an alternative receive/transmit timing adjustment technique that lack encoded phase counters and (in at least one embodiment) phase count comparators.

DETAILED DESCRIPTION

In various embodiments herein, signal receive/transmit operations are executed with respect to timing pulses selectively extracted from an over-clocked timing reference by digital timing-phase alignment circuitry. While the various disclosed embodiments may be deployed in virtually any environment and implemented using traditional resistor-transistor logic (RTL) circuit elements, many of the over-clocked digital phase adjuster implementations are particularly well-suited to deployment in cryogenic environments and implementation with various superconducting devices (e.g., rapid single-flux-quantum (RSFQ) logic elements or other Josephson-junction-based logic families)—devices in which conventional analog phase-adjust techniques are difficult to implement or altogether impracticable. Moreover, in such environments, it becomes possible to achieve extreme overclocking relative to signaling data rate (e.g., clock rates ten to 100 or more times the signaling link bit rate) with very low power expenditure, even where the counterpart signaling device (i.e., destination for outbound signals and source of inbound signals) is disposed in a substantially warmer temperature domain. For example, in a number of embodiments disclosed herein RSFQ logic elements (or other Josephson-junction devices) are used to effect purely digital timing-phase adjustment by extracting timing events from an overclocked timing reference ("fast clock" or FCLK) while expending exceedingly low energy per bit, in some cases in the neighborhood of a pico-joule per bit or less.

In a number of mesochronous embodiments, the over-clocked timing reference is sub-divided by an over-clock factor N (e.g., N=5, 8, 10, 16, 50, 100, etc.) to yield a data-rate timing signal, "RefCK", that exhibits a timing event per bit interval of a transmitted or received waveform. Because each bit interval spans a respective set of N timing events within the over-clocked timing reference, an $i^{th}$ one of those timing events may be selected to time signal reception or transmission, with selection index 'i' ranging from 0 to N−1 and adjustable via timing calibration executed at system startup and occasionally thereafter. For example, in a 16× over-clocked timing reference (16 timing events per received or transmitted bit), every $7^{th}$ timing event may initially be selected for signal reception (or transmission) timing and adjusted up or down in periodic (or occasional) timing calibration thereafter to compensate for timing drift (e.g., progressing to the $8^{th}$ timing event and then to the $9^{th}$ or back to the $7^{th}$, etc.).

In a number of plesiochronous embodiments, the over-clocked timing reference may have an arbitrary frequency relation to an independently generated data-rate timing signal (also referred to herein as RefCK) such that a non-integer number of over-clocked timing cycles transpire per bit time, $t_{bit}$. In such embodiments, the over-clocked timing reference may be reset (or re-timed) and corresponding event-timing counter may be reset during each cycle of the data-rate timing signal to implement a per-bit sample-timing or transmit-timing vernier. As in mesochronous embodiments, a particular one of the multiple over-clocked timing events that transpire in each bit time may be selected to time signal reception and/or transmission.

FIG. 1 illustrates an exemplary signaling system 100 in which constituent integrated circuit devices (IC's) 101 and 131 signal one another from disparate temperature domains and in which an overclocked timing reference is used to enable purely digital signal timing adjustment. In the embodiment shown, both temperature domains are low temperature domains, but the colder "superconducting" domain is cooled below the critical temperature of some or all on-chip conductors (e.g., 4 Kelvin or "4 K") to enable implementation of exceedingly fast and low power circuits based on superconducting "Josephson-junction" (JJ) circuit elements. The "warmer" domain temperature is shown as 77 K and functional circuit blocks within the resident IC 131 (referred to herein as the "warm IC" in contradistinction to "cold IC" 101) may be implemented by resistor-transistor logic (RTL) and thus by complementary metal oxide semiconductor (CMOS) circuit elements or the like. While these exemplary temperature domains and circuit element implementations (i.e., JJ-based circuits in the superconducting domain, RTL circuits in the warm domain) are carried forward in various embodiments below, in all cases the exact temperatures of the colder and warmer domains may be higher or lower than those shown, and the circuit element implementations may vary.

Still referring to FIG. 1, the cold and warm ICs (101 and 131) are interconnected by a number of signaling links 108, 109 that permit bidirectional and/or unidirectional transmission of data signals, command signals, address signals, control signals, timing signals or any other signals as necessary/useful to coordinate operations of the system or subsystem. As a point of terminology, unless otherwise made clear by context, reference herein to "data" or "data signal" should be understood to encompass any and all information-bearing signals and "timing signal" should be understood to be a clock signal, strobe signal or any other signal that conveys timing information between the subject ICs. Moreover, while convenient in many instances to refer to "clock signals," and "clocking" in connection with signal-transfer timing, in all such cases, strobe signals or other occasionally idled (paused) timing signals may be used instead of continuously oscillating clock signals.

Although two oppositely-directed unidirectional differential signaling links 108 and 109 are depicted in FIG. 1, any number of signaling links may be implemented in alternative embodiments, and any one or more of such signaling links may be bidirectional and/or single-ended. Also, while virtually any chip-to-chip signaling system may be implemented using the techniques and circuit arrangements disclosed herein (e.g., wherever signal input/output and/or network interface is useful), for purposes of example, the signaling system of FIG. 1 and embodiments described below are assumed to constitute a memory system or portion thereof in which a memory control function is implemented within cold IC 101 (i.e., within the superconducting-domain) and a memory function (data storage) is implemented within warm IC 131. In such example, cold IC 101 may be a CPU (having one or multiple CPU cores), a dedicated memory control component, or any other device having a memory control function, and warm IC 131 may be a memory IC (e.g., having a core storage array implemented by dynamic random access memory, static random access memory, NAND and/or NOR Flash memory or any other type of on-chip nonvolatile or nonvolatile storage cell array). In alternative embodiments, physical signaling interfaces as shown in FIG. 1 may be used for any high-speed link or links (i.e., networking, storage controllers, IO Hubs, PCIe, etc.), particularly those that convey signals between superconducting ("cold") and cryogenic ("warm") temperature domains.

In the exemplary embodiment of FIG. 1, signaling between the cold and warm ICs is carried out within counterpart synchronous physical signaling interfaces 103 and 133 (PHYs) at a data rate established by the aforementioned reference clock signal, RefCK. As discussed below, the RefCK frequency may be increased as timing phase alignment becomes more precise, with higher RefCK frequencies corresponding to higher per-link data rates and thus higher system signaling bandwidth. Respective RefCK instances within the warmer and colder domains may be mesochronous (i.e., derived from a common frequency source and thus frequency matched despite arbitrary and time-varying phase offset) or plesiochronous (generated by separate frequency sources ensured to exhibit frequency inequality no greater than a specified deviation/tolerance). Moreover, even in mesochronous environments, one or more overclocked timing references within the superconducting domain may be plesiochronous with respect to RefCK, though re-timed with respect to RefCK timing events in at least one embodiment.

Referring specifically to warm IC 131, outbound data is transferred from IC core 132 (e.g., memory core and access circuitry within a memory IC or data routing circuitry within a buffer IC) to data transmit circuitry within PHY 133. In the particular embodiment shown, for example, the outbound data passes through multiplexer 155 (which selectively enables a calibration data loopback as discussed below) and clocked into transmit register 153 in response to edges (transitions) of a clock signal, CK. The "timing" edges of CK may be limited to exclusively rising or exclusively falling edges, or may include both rising or falling edges, but in either case clock a stream of outbound data bits into transmit register nominally at the RefCK rate to enable signal driver 151 to drive a corresponding time-varying low-voltage-swing differential signal (LSDiff) onto signaling link 108. Ideally, each bit within the transmitted bit stream is valid on the signaling link (and thus at the cold-IC PHY) for a respective "$t_{bit}$" interval (i.e., respective RefCK period) such that the transmitted bit may be sampled within the cold IC PHY (103) at any point in the $t_{bit}$ interval. In reality, time is required to effect a voltage swing on the signaling link and at the cold IC PHY input so that the viable sampling interval for the transmitted bit (i.e., the data eye width) is somewhat briefer than $t_{bit}$. Moreover, various sources of signaling noise and setup/hold time constraints within the cold IC PHY further constrain the timing window for sampling (capturing) a given data bit with desired reliability, so that ability to precisely align and maintain alignment of the data receive sampling instant directly impacts the minimal $t_{bit}$ duration and thus the maximum signaling rate between the two ICs.

Still referring to warm IC PHY 133, data inbound via differential link 109 is converted from LSDiff to CMOS signaling levels within amplifier/level-converter 141 and then clocked into register 143 in response to edges of a quadrature clock signal—that is, a clock signal (CK+φ) phase-shifted relative to transmit clock CK by an angle, φ, nominally equal to $t_{bit}/2$, such that, in an ideal alignment, CK+φ triggers sampling (within register 143) of each bit of the inbound data stream at the nominal center of the data eye.

Data flow in cold IC 101 is reversed relative to that of warm IC 131, with inbound data from link 108 received via converter/amplifier 111 and clocked into receive register 113 for delivery to the cold IC core 102. Conversely, transmit data from IC core 102 is clocked into transmit register 123 and output via signal driver 121 onto link 109. In the particular embodiment shown and others described below, the cold IC PHY 103 is implemented with rapid single-flux-quantum (RSFQ) logic elements or like technologies in which Josephson junctions are used to control the transfer of short-lived low-amplitude quantized pulses between superconducting storage elements and thereby enable implementation of extremely fast, low-power digital circuits. Various embodiments of these digital circuits are detailed below.

Still referring to FIG. 1, the finite signal propagation time over signaling links 108 and 109 imposes an arbitrary (propagation-time-dependent) phase offset between counterpart clock signals (or strobe signals) used to time data reception and transmission in the cold and warm ICs—a phase offset initially unknown at system startup and subject to drift over time due to changes in voltage and temperature. While precision analog timing calibration circuits may be deployed within warm IC 131 to provide timing compensation (i.e., account for the time-varying phase offset), such circuits tend to dissipate considerable power; an expensive proposition even in the relatively warm (e.g., 77 K) chamber as a multiple of the timing calibration power is typically required to extract the resulting heat energy. Matters are complicated further in cold IC 101 where various analog timing circuit techniques that form the backbone of timing alignment circuits in modern high-speed chip-to-chip signaling technologies (e.g., phase mixing circuits and phase interpolators) are rendered impracticable by the quantized nature of Josephson-junction signal transfer.

In the embodiment of FIG. 1, high-precision timing phase alignment is achieved with exceedingly low power expenditure through implementation of digital phase adjustment circuitry exclusively within the superconducting domain. More specifically, cold IC 101 includes within PHY 103 a digital receive-phase adjuster circuit 115 that extracts selected timing events ("phases") within an overclocked timing reference to phase-align a receive clock signal $CK_R$ with the data-eye midpoints of the incoming bit stream. In the asymmetric calibration scheme shown (i.e., calibration of both the transmit and receive signaling directions implemented entirely in one IC), cold-IC PHY 103 additionally includes a digital transmit-phase adjuster 125 to extract selected phases of the overclocked timing reference and thereby advance or delay data transmission as necessary to center (or otherwise align) data-eyes within a transmitted bit stream with respect to the warm-IC receive clock ($CK+\phi$). Note that the expression "data-eye," often used in connection with NRZ (non-return-to-zero) signaling waveforms (i.e., logic bit conveyed as an "eye" that opens at the start of the data-valid window and remains open until the close of the data-valid window), is used herein to refer also to the available sampling interval for return-to-zero (RZ) waveforms. In the case of quantized pulse streams generated within PHY 103, for instance (an example of RZ signaling), the "data eye" can be viewed as the time window in which signal receiver 111 may emit a quantized pulse. In either case, NRZ or RZ, timing alignment refers to adjustment of the signal sampling instant to a desired temporal position within the data-valid window or data eye.

As discussed in greater detail below, one or more error detecting circuits are also provided within the cold-IC PHY 103 (or core circuitry 102) to enable identification of upper and lower boundary phases at or beyond which received bit error rate (BER) exceeds a hard-wired or programmed failure threshold. In the embodiment of FIG. 1 these error detect circuits are shown at 117 and 127 (within phase adjusters 115 and 125, respectively), with receive error detector 117 outputting a receive phase adjustment signal ($Adj_R$) to receive phase controller 119 to establish the receive clock phase (i.e., phase of $CK_R$) midway between the boundary phases identified during cold-side receive timing calibration, and transmit error detector similarly outputting a transmit phase adjustment signal ($Adj_T$) to transmit phase controller 129 to establish the transmit clock phase (phase of $CK_T$) midway between boundary phases identified during cold-side transmit timing calibration. In the particular implementation shown, each of phase controllers 119 and 129 receives the data rate reference clock (RefCK)—a timing reference which may be generated within either cold IC 101 or warm IC 131 (and forwarded from one IC to the other) or within another integrated circuit device.

FIGS. 2A and 2B illustrate exemplary receive and transmit timing calibration operations that may be carried out to identify receive and transmit boundary clock phases, respectively (and center or otherwise establish $CK_R$ and $CK_T$ therebetween). Referring first to FIG. 2A, a predetermined calibration data pattern is transmitted by the warm IC and sampled within the cold IC receiver PHY in response to timing edges within a leading-edge receive-boundary clock $CK_{RY}$. The $CK_{RY}$ clock phase is incrementally delayed from a minimally-delayed (most-advanced) timing point until samples of the incoming calibration data pattern match expected values (i.e., BER below threshold error rate) and then incrementally advanced to confirm the failure boundary at the leading edge of the data eye in each sampled calibration bit. Thereafter, the digital receive-phase adjuster begins sampling the incoming calibration data pattern in response to timing edges within trailing-edge receive-boundary clock $CK_R z$, incrementally increasing the delay in that boundary clock until the failure boundary is identified at the trailing edge of incoming data eyes (i.e., delaying until the calibration data is successfully received—BER below threshold—and then continuing to increment the delay until the BER again rises above the failure threshold). Having identified the leading-edge and trailing-edge receive timing boundaries, the receive-phase adjuster positions the run-time receive clock, $CK_{RO}$, at the nominal midpoint (exact midpoint or with programmed offset from exact midpoint) between the failure boundaries and thus at the desired sampling point with respect to data transmitted by the cold IC. FIG. 2A illustrates this arrangement post-calibration, showing edge-alignment between the warm-IC transmit clock (CK) and bitstream ($DQ_{warm}$), an instance of the transmitted bitstream after propagating across the signaling link ($DQ_{cold}$), leading-edge and trailing-edge receive timing boundaries (or "failure" boundaries) marked by $CK_{RY}$ and $CK_{RZ}$, and $CK_{RO}$ centered between those boundaries. FIG. 2B illustrates a post-calibration view of the cold-side transmit timing calibration. In this case, the $CK_{TY}$ and $CK_{TZ}$ phases that mark failure boundaries in the warm-side receiver (e.g., as determined by circulating the warm-side calibration samples back to the cold-side receiver via the loopback path through multiplexer 155 of FIG. 1) and corresponding warm-side data alignments with respect to $CK+\phi$. As shown, $CK_{T0}$ is centered between the failure boundaries so that, after the signal propagation delay, data transmitted by the cold-side PHY arrives within the warm-side PHY in the desired quadrature alignment with the $CK+\phi$ sampling clock.

Figure 3:
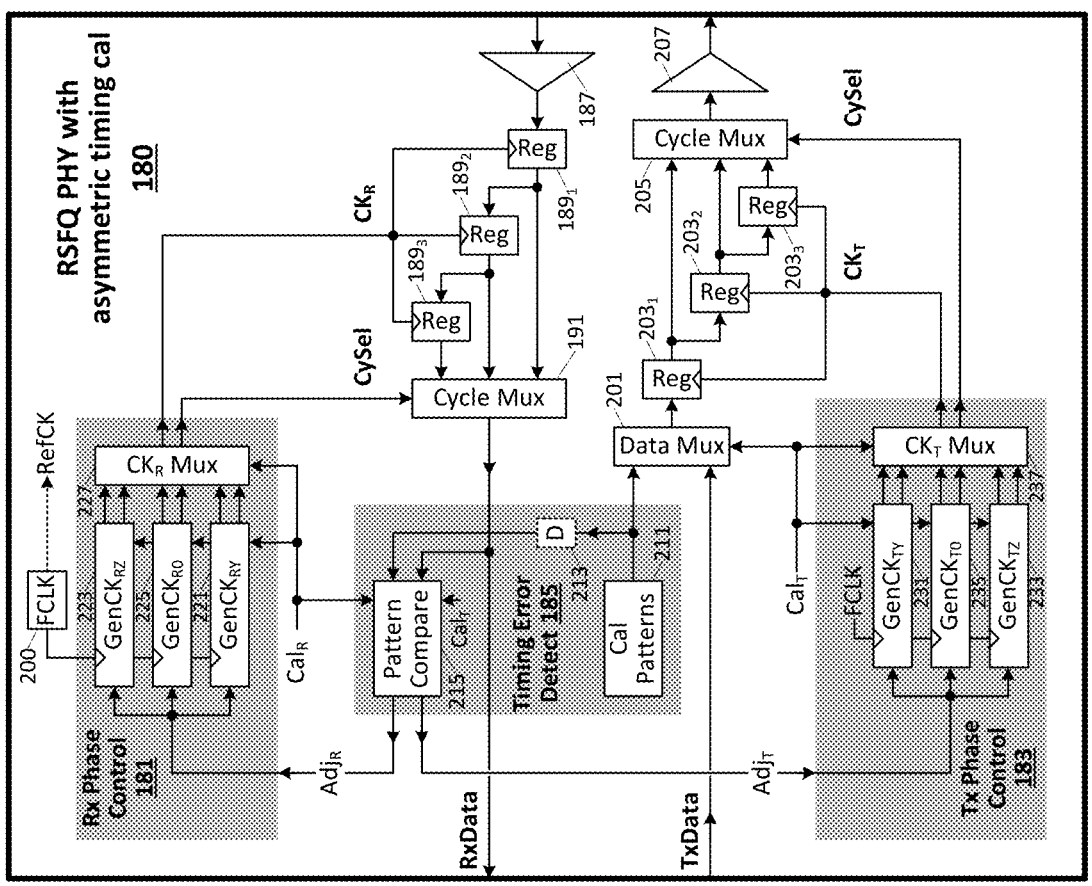
FIG. 3 illustrates a more detailed embodiment of a superconducting-domain PHY (physical signaling interface) having receive and transmit timing calibration circuitry implemented by rapid single-flux-quantum (RSFQ) circuit elements.

FIG. 3 illustrates a more detailed embodiment of a superconducting-domain PHY 180 having RSFQ-implemented receive and transmit timing calibration circuitry. In the inbound data path, a low-voltage-swing differential signal is received within converter/amplifier 187 and output as an RSFQ-level pulse stream to registers $189_1$-$189_3$ (referred to generally or collectively as registers 189—a convention applied herein with respect to like-numbered elements distinguished by different subscripts), with registers 189 daisy-chained to form a shift register clocked by receive clock, $CK_R$. As shown, each of the register outputs is supplied to a "cycle" multiplexer 191 which responds to a cycle-select signal (CySel) by selecting the output of one of the three registers 189 as the received data bit (RxData), thereby providing coarse timing adjustment over a range of three whole $CK_R$ cycles. More or fewer daisy-chained registers 189 may be provided in alternative embodiments to expand or reduce this whole-cycle timing adjustment capability.

Still referring to FIG. 3, each data bit passed by multiplexer 191 is supplied, together with receiver-calibration pattern data from a calibration pattern data source 211 (and optionally delayed by delay element 213 to achieve nominal alignment), to pattern compare circuit 215. When enabled by a receive-calibration control value, $Cal_R$, compares the received data stream with the receiver-calibration pattern data, outputting a receive-timing adjust signal ($Adj_R$) in respective states to indicate data match or mismatch. Though not specifically shown, pattern compare circuit 215 may determine a bit error rate from the match/mismatch results (i.e., indicative of the rate at which bits in the received data stream fail to match the expected data pattern) and raise or lower $Adj_R$ according to whether the bit error rate (BER) exceeds a threshold error rate. In any case, $Adj_R$ is supplied to a receive phase control circuit 181 to enable phase adjustment of the receive boundary clocks and the run-time receive clock, for example, as discussed in reference to FIGS. 1 and 2A. In depicted phase controller embodiment, a receive clock multiplexer 227 selects one of three receive clock generators 221, 222 or 223—including respective clock generators for the leading and trailing boundary clocks, $CK_{RY}$ and $CK_{RZ}$, and a clock generator for the run-time receive clock $CK_{RO}$—to output a timing control tuple that includes the CySel signal supplied to cycle-select multiplexer 191 (i.e., to enable whole-cycle receive timing adjustment) and the receive clock signal ($CK_R$) supplied to the data sampling registers 189.

The data transmit path within RSFQ PHY 180 is essentially the reverse of the data receive path, with normal-path transmit data (TxData) passing through data multiplexer 201 and then propagating through daisy-chained registers 203 (i.e., shift register formed by register $203_1$, $203_2$ and $203_3$) to enable whole-cycle timing adjustment via cycle multiplexer 205. As shown, cycle multiplexer 205 supplies the cycle-selected transmit data value to signal driver 207 for level conversion (i.e., from quantized RSFQ pulse to low-voltage-swing differential signaling level) and output onto an external signaling link.

Data transmission timing is controlled by transmit phase controller 183 which outputs a time-varying transmit clock signal (CKT) to registers 203 and CySel signal to cycle multiplexer 205. During transmit timing calibration—signaled by a transmit-calibration control value, $Cal_T$—calibration pattern data from pattern generator/source 211 is selected via multiplexer 201 (i.e., instead of normal-path data from the IC core) and transmitted in accordance with the $CK_T$ phase and whole-cycle offset. The transmitted calibration data is looped back to the data receiver within RSFQ PHY 180 via the recipient IC PHY (e.g., as shown in FIG. 1), thus enabling timing error detector 185 to generate a transmit-timing adjust signal ($Adj_T$) indicative of calibration pattern match/mismatch (note that delay element 213 may be switched into the calibration pattern data path during transmit timing calibration to deliver the calibration data pattern to pattern compare circuit with a delay nominally equal to the loopback path delay). As with receive-timing calibration, $Adj_T$ is applied within transmit phase controller 183 to adjust the phases of the transmit boundary clocks, $CK_{TY}$ and $CK_{TZ}$ (i.e., to identify failure timing boundaries as discussed above), and center the run-time transmit clock, $CK_{T0}$, between the failure boundaries. Transmit clock multiplexer 237 selects one of three transmit clock generators 231, 233, 235 (i.e., for $CK_{TY}$, $CK_{TZ}$ and $CK_{T0}$, respectively) to output the CySel and $CK_T$ tuple during calibration operations ($CK_{TY}$ and $CK_{TZ}$, one after the other as shown, for example, in FIG. 2B) and for live data transmission ($CK_{T0}$).

In the embodiment of FIG. 3 and others discussed below, clock generators 221-225 and 231-235 are identically implemented and each receive an over-clocked timing reference, referred to herein as "fast clock" or FCLK. In a number of implementations the fast clock frequency is at least eight times greater than the RefCK frequency (i.e., "8×" over-clocking factor), and may be as high as 100× or more. In other embodiments the overclocking factor may be as low as 4×, though, as will become clear, higher overclocking factors provide greater timing control resolution and thus smaller quantized phase error. In the mesochronous implementation of FIG. 3, FCLK is generated by on-die clock generating circuit 200 and frequency-divided to yield RefCK such that the FCLK frequency is an integer multiple of the reference clock frequency (e.g., a power-of-two multiple where divide-by-two clock dividers are used). RefCK may also be forwarded (transmitted) to the warm IC to serve as (or enable derivation of) the CK and CK+φ timing signals discussed above. In other plesiochronous embodiments, discussed in greater detail with respect to FIGS. 13-18, the fast clock and RefCK signals may be generated independently so that the fast clock frequency may be a non-integer (and time-varying) multiple of the RefCK frequency.

FIG. 4 illustrates an exemplary phase adjustment/selection operation that may be carried out within any one of the receive clock generators 221-225 of FIG. 3 to generate respective receive clock signals $CK_{RY}$, $CK_R z$ or $CK_{RO}$ (corresponding operations may be executed within clock generators 231-235 to generate transmit clock signals). In the particular implementation shown, the over-clocked timing reference (fast clock, FCLK) oscillates at 100 GHz (10 picosecond interval between quantized timing pulses) and is subdivided by 16 (e.g., by a sequence of four binary frequency dividers not specifically shown) to generate a 6.25 GHz RefCK signal. As discussed above, the RefCK signal corresponds to the inbound and outbound signaling rate so that the 160 picosecond RefCK period corresponds to the nominal bit-valid interval ($t_{bit}$) of a symbol at any point along the serial data path, on- or off-chip. As further explained above, the desired sampling instant of an inbound data signal and the desired transmit instant of an outgoing data signal may have an arbitrary phase with respect to the RefCK instance within the cold-IC PHY. Accordingly, in the embodiment of FIGS. 3 and 4, phase select circuitry 240 within each of clock generators 221-225 enables adjustable selection of any one of the sixteen FCLK timing pulses that occur per RefCK period to be output as the subject clock signal (e.g., $CK_{RY}$, $CK_{RZ}$ or $CK_{RO}$ in the case of the receive clock generators), thus providing a 10 picosecond timing adjust resolution (6.25% of $t_{bit}$ per phase step). As discussed below, in one embodiment, phase selector 240 responds to the state of the incoming adjust signal, $Adj_R$ (which may be a two-bit signal capable of representing up, down ('dn') and no-change signal states), by incrementing or decrementing the FCLK timing phase selection and thus retarding or advancing the receive clock phase. In the example shown, $CK_{Rn}$ (representative of $CK_{RY}$, $CK_Rn$ or $CK_{RO}$) is incrementally adjusted to select FCLK pulse 9 (from the sixteen available timing pulses 0 to F, hexadecimal) and thus establish a 90 picosecond phase offset relative to RefCK (i.e., $t_{PhO}$=90 picoseconds). Transmit clock generators may carry out the same timing pulse selection in response to $Adj_T$ to calibrate the phases of clock signals $CK_{TY}$, $CK_{TZ}$, $CK_{T0}$.

Figure 5:
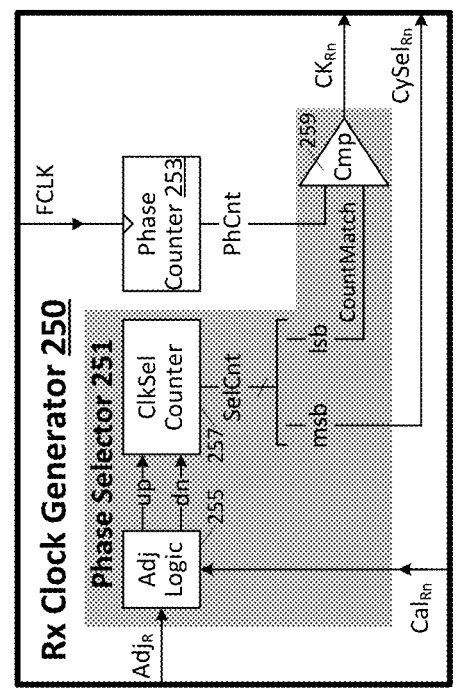
FIG. 5 illustrates a more detailed embodiment of a receive clock generator that may be used to implement any or all of receive clock generators within the RSFQ PHY of FIG. 3.

FIG. 5 illustrates a more detailed embodiment of a receive clock generator 250 that may be used to implement any or all of receive clock generators 221-225 within the RSFQ PHY of FIG. 3 (which same general circuit architecture may be used to implement the transmit clock generators). As shown, clock generator 250 includes a phase counter 253 that increments a modulo phase count ("PhCnt") in response to FCLK timing pulses (thus counting the timing pulses), and a phase select circuit 251 that generates an output timing pulse within output clock $CK_{Rn}$ each time the phase counter advances to a selected phase count value. Phase select circuit 251 (or "phase selector") includes a phase-adjust logic circuit 255 that, when enabled by the receive-calibration control value $Cal_{Rn}$, responds to the state of the receive-timing adjust signal ($Adj_R$) by asserting count-up and count-down signals "up" and "dn" (or deasserting both signals if no adjustment is signaled) to increment and decrement a clock-select counter 257. In the embodiment shown, the least significant bits of the clock-select count are supplied as a "count-match" value to comparator 259. Comparator 259, accordingly, generates a timing pulse on the $CK_{Rn}$ output each time the phase count advances to (and thus matches) the count-match value. In the 16× over-clocking example of FIG. 4, for instance, a count-match value (lower four bits of the clock-select count) of nine (9) will generate a $CK_{Rn}$ pulse at every sixteenth cycle of the FCLK signal that increments the modulo-16 phase counter to 9.

Still referring to FIG. 5, the most significant bits of the clock-select count represent whole $t_{bit}$ intervals and thus may be output as the cycle-select value (CySel) discussed above. That is, as the count-match value overflows from 15 to 0 or underflows from 0 to 15, the cycle select value is incremented or decremented, respectively, to select the output of a different one of daisy-chained receive registers (e.g., 189 of FIG. 3) via the cycle multiplexer discussed above. The same operation may be carried out to effect whole-cycle timing adjustments within the data transmit path.

Figure 6:
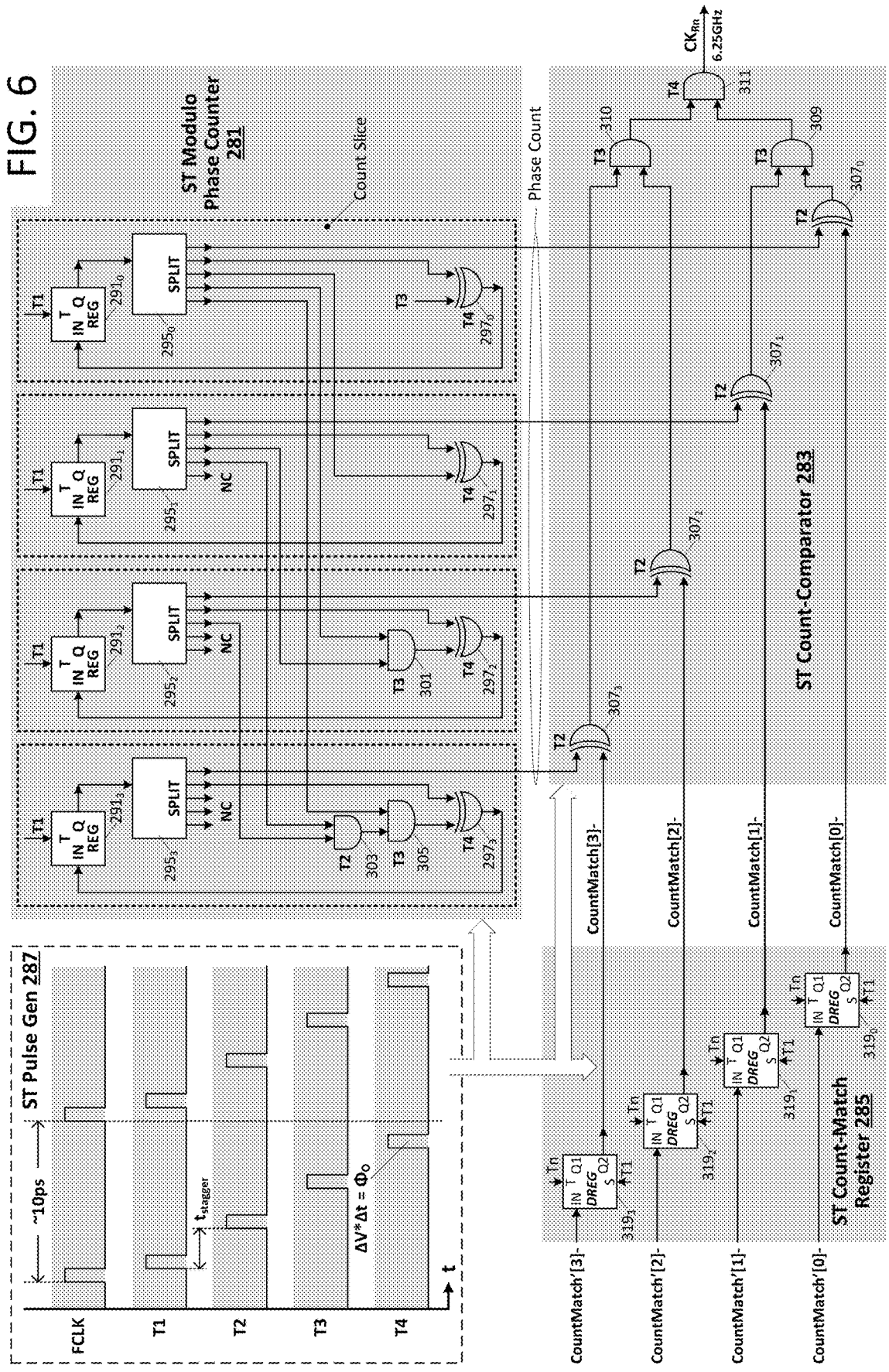
FIG. 6 illustrates embodiments of a self-timed modulo-16 phase counter and self-timed count-comparator, and also a self-timed count-match register that may store a 4-bit count-match value generated, for example, by the clock-select counter of FIG. 5.

FIG. 6 illustrates embodiments of a self-timed modulo-16 phase counter 281 and self-timed count-comparator 283 (e.g., that may implement the phase counter and comparator shown in FIG. 5), and also a self-timed count-match register 285 that may store a 4-bit count-match value generated, for example, by the clock-select counter of FIG. 5. In the implementation shown, logic elements within phase counter 281 are implemented by RSFQ circuit elements that operate analogously to RTL circuit elements except that each of such elements require a quantum timing pulse input to trigger a digital output (i.e., logic '1' indicated by presence of quantum output pulse, or logic '0' indicated by absence of quantum output pulse). FIGS. 7A-7I and FIG. 8 detail this operation with respect to various RSFQ circuit elements shown in FIG. 6 and others deployed in embodiments described below. More specifically, each of FIGS. 7A-7I illustrates the RTL model for a given RSFQ circuit element including:

- a buffer element 331 (FIG. 7A) that generates a quantum pulse output in response to a quantum pulse input.
- a splitter element 341 (FIG. 7B) that generates matching quantum pulse outputs in response to a quantum pulse input (splitter elements may be coupled in a tree structure to yield an arbitrary number of same-phase quantum pulse outputs and/or staggered-phase quantum pulse outputs at various leaf nodes).
- a join element 351 (FIG. 7C) which merges temporally proximal quantum pulse inputs into a single quantum pulse output.
- a register element 361 (FIG. 7D) which latches an incoming quantum pulse, if any, and generates an output according to the latched state (i.e., quantum pulse out if latched input pulse, no quantum pulse out if no input pulse latched) when triggered by a timing pulse (T). As can be seen in the RTL model, the register element may be viewed as an asynchronous SR latch that is set in response to a logic-true input and destructively read out in response to the timing pulse (i.e., the timing pulse resets the state of the RSFQ register element).
- a data-register element 371 (FIG. 7E) which operates in the same manner as the register element of FIG. 7D, but additionally includes a non-destructive readout port (Q2) responsive to a timing pulse (S).
- a toggle-register element 381 (FIG. 7F) which toggles between true and complement states in response to a timing pulse (T), outputting a quantum pulse via one output port (Q+) upon transitioning to the true state and outputting a quantum pulse via the other output port (Q−) upon transitioning to the complement state.
- an XOR element 391 (FIG. 7G) which generates a quantum output pulse in response to timing pulse (T) according to the exclusive-OR of the state of its inputs during the interval since the prior timing pulse assertion. That is, if, during the interval since the prior timing pulse assertion, a quantum pulse has been received on either of the inputs and not on the other, the XOR element will output a quantum pulse. As in the case of the RSFQ register element and data-register element, the readout operation (triggered by timing pulse, T) clears the state of the RSFQ XOR element (modeled by clearance of the two SR latches shown in the RTL analog), thus readying the XOR element for a subsequent XOR operation.
- an OR element 401 (FIG. 7H) which operates generally as described with respect to the XOR element of FIG. 7G, but generating—in response to timing pulse, T—a logic OR of the captured input states.
- an AND element 411 (FIG. 7I) which also operates generally as described with respect to the XOR element of FIG. 7G, but generating a logic AND of the captured input states in response to the timing pulse (T).

Figure 8:
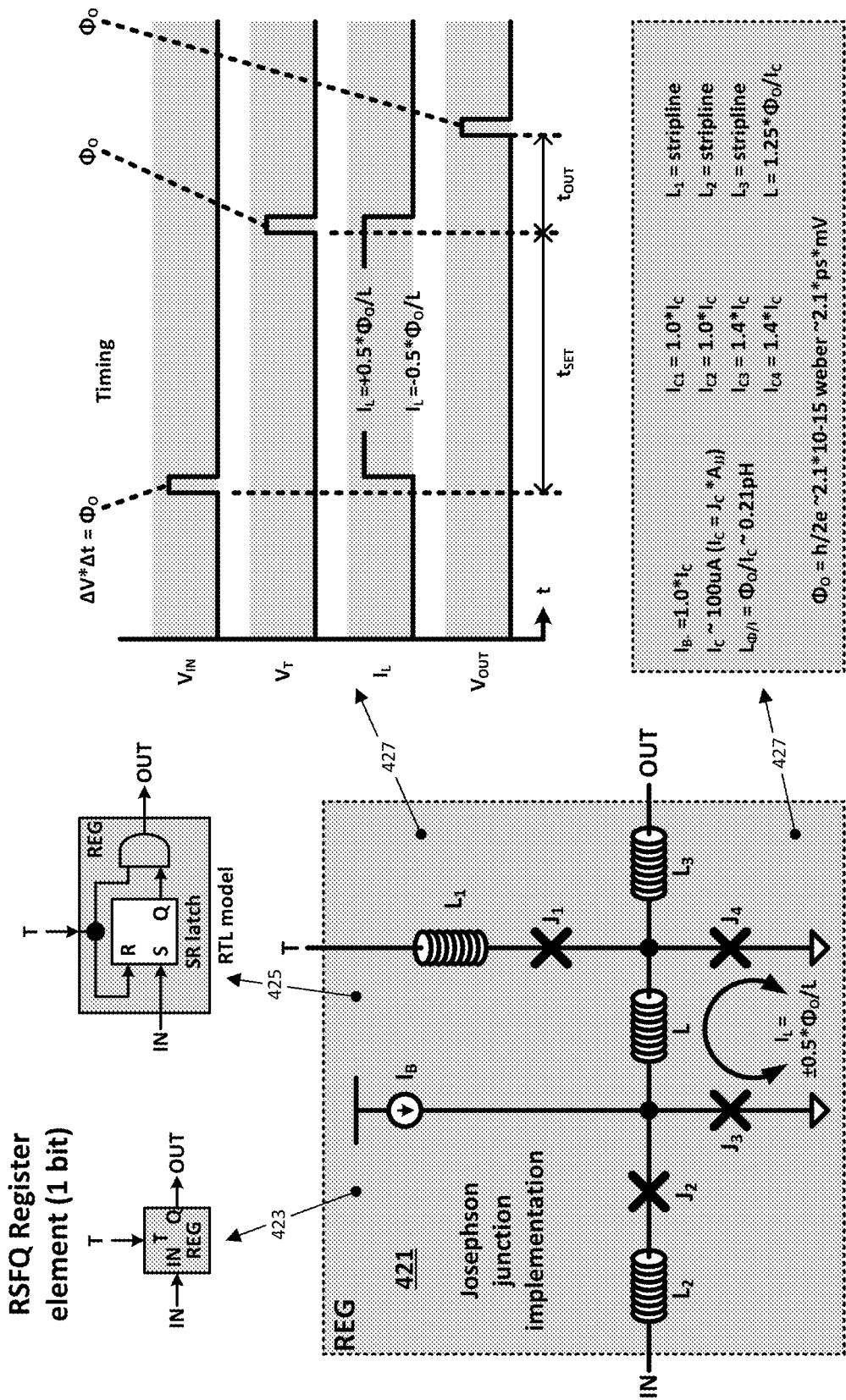

FIG. 8 illustrates an exemplary Josephson-junction implementation 421 of the RSFQ register element 361 of FIG. 7D and signal timing therefor. The symbol and RTL model of the register element are shown at 423 and 425, respectively. As shown, an incoming quantum pulse ($\Phi_0$ having voltage step $\Delta V$ and width $\Delta t$) at input node "IN" transfers sufficient energy across Josephson-junction $J_2$ to flip the direction of a current ($I_L$) infinitely circulating (superconducted) through Josephson junctions J3 and J4 and inductance L, thereby latching a "set" logic state within the register element. Thereafter, a quantum pulse (T) delivered at node T, selectively enables either a quantum pulse output at output node "OUT" or no quantum pulse at the output node according to whether the register element has been set by an input quantum pulse. Exemplary relationships between a bias current $I_B$ and critical current Ic (and components thereof flowing in inductive elements $L_1$, $L_2$ and $L_3$) are shown at 427, together with exemplary inductance values and quantum pulse time-amplitude values. Characteristic setup and output-delay times ($t_{SET}$ and $t_{OUT}$, respectively) are shown in an exemplary input/output timing diagram at 429.

Returning now to FIG. 6, it can be appreciated that the logic output from each RSFQ register element and logic gate (XOR and AND) within modulo phase counter 281 and from each logic gate (XOR and AND) within comparator 283 is triggered by a timing pulse, and further that propagation of a logical output through a canonical coupling (i.e., output of one RSFQ element coupled to input of another) of two or more RSFQ circuit elements requires a temporal offset between the timing pulses delivered to those logic elements sufficient to account for output pulse generation time (tour) from the upstream element and setup time ($t_{SET}$) for the downstream element. Accordingly, in the embodiment of FIG. 6 and other RSFQ embodiments described below, a self-timing pulse generator 287 is provided to generate a time-staggered set of timing pulses (depicted as T1, T2, T3, ..., Tn) in response to each FCLK pulse. As shown, T1 clocks a phase count value out of counter-state register elements $291_0$-$291_3$ (i.e., a set of four RSFQ register elements), with each bit of the count value being replicated in multiple instances via a respective splitter element $295_0$-$295_3$. In general, the splitter delay is less than the time-stagger interval between successive self-timing pulses (i.e., less than $t_{stagger}$ as shown with respect to self-timing pulse generator 287) so that the phase count output appears at the input of the modulo counter logic gates (AND gates 301, 303 and 305 and XOR gates $297_0$-$297_3$ shown within counter 281) before delivery of timing pulses T2, T3 and T4. Accordingly, the least significant bit of the phase count (output from register element $291_0$ and replicated in splitter $295_0$) arrives at and is captured within XOR gate 297o prior to assertion of timing pulse T3 at the other input of the XOR gate, and the T3 pulse occurs before timing pulse T4 enables the XOR output. The XOR output (i.e., from gate 297o) is feedback to the input of counter-state register $291_0$ and will itself be a logic '1' (quantum pulse) if the least significant bit of the phase count is '0' (i.e., no quantum pulse output from register ## in response to timing pulse T1) and a logic '0' (no quantum pulse) if the least significant bit of the phase count is '1' and thus will cause the least significant phase count bit output from register $291_0$ to toggle at every FCLK cycle. Applying this same analysis to the counter slices for remaining phase count bits 1, 2 and 3, it can be seen that phase count bit 1 (captured within register $291_1$) will change state every other FCLK cycle, phase count bit 2 (within register $291_2$) will change state every fourth FCLK cycle, and phase count bit 3 (within register $291_3$) will change state every eighth FCLK cycle, thus implementing a modulo 16 counter within the four counter slices.

XOR gates $307_0$-$307_3$ within comparator 283 each receive a respective bit of an active-low count-match value (i.e., "CountMatch[0]-" signifies a logic '0' by delivering a quantum pulse and a logic '1' by absence of a quantum pulse) at one input and a respective active-high phase count bit at the other. Accordingly, when (and only when) the count-match value matches the phase-count value, quantized pulses (logic '1') will be generated by all four XOR gates in response to timing pulse T2, which will in turn yield logic '1' outputs from AND gates 309 and 310 in response to timing pulse T3 and finally a logic '1' output from AND gate 311 in response to timing pulse T4. Thus, in the modulo-16 counter arrangement shown, comparator 283 will generate, as $CK_{Rn}$, a quantized output pulse once every 16 FCLK cycles—once every $t_{bit}$ interval—at a phase offset in accordance with the match-count value. Accordingly, the match-count value may be increased or decreased to retard or advance the phase of the $CK_{Rn}$ timing signal, with 10 picosecond phase-adjust resolution.

In the embodiment of FIG. 3 the self-timed count-match register 285 (which may constitute at least part of the counter state within the clock-select counter of FIG. 5), is implemented by data-register elements $319_0$-$319_3$ that may be non-destructively read-out in response to timing pulse T1 (thus yielding active-low count-count match outputs to the inputs of comparator XOR gates 307 in time for the T2-triggered XOR operation). As shown, the individual count-match register elements 319 may be loaded with an updated count value (CountMatch'[3:0]-) in response to any pulse after T1 (illustrated as 'Tn').

Referring again to the phase counter implementation in FIG. 3, because the phase count value is clocked out of phase-count registers 291 at every timing pulse T1 (i.e., once per FCLK cycle), the output phase count triggered by a given T1 pulse must propagate through the count-increment logic gates (XOR gates and AND gates) to produce and load the next count value back into those same phase-count registers before the next T1 timing pulse fires. That is, the minimum time required to return the next-count value to the phase-count registers—a time established by the longest chain of gates in the feedback path between a phase-count register's output and input and thus in the most-significant-bit counter slice—constrains the maximum practicable (ceiling) FCLK frequency. The FCLK ceiling frequency, in turn, establishes the phase-adjust resolution (over-clocking factor) for a given data rate and, conversely, the data rate ceiling for a given phase-adjust resolution. In the parallel-count-load implementation shown (i.e., all counter state registers 291 loaded in parallel), four timing pulses are needed to deliver an updated state value to the most-significant count-bit register—the critical timing path. Assuming a $t_{stagger}$ in the neighborhood of 2.5-3.0 picoseconds and a 16× over-clocking factor, the FCLK ceiling frequency becomes ~100 GHz (i.e., to provide sufficient time for timing pulses T1-T4 to deliver the updated phase-count value to the counter-state register $291_3$) and the data-rate ceiling becomes 6.25 Gb/s per link.

FIGS. 9 and 10 illustrate alternative phase counter embodiments having shortened critical feedback paths between phase-count register output and input to permit higher FCLK frequencies and correspondingly higher signaling rates (or increased phase-adjust resolution for a given signaling rate). In the exemplary ripple-counter 450 of FIG. 9, a phase-count value is output from each of N count-state registers $451_0$-$451_n$ in sequence, starting with the least significant bit and progressing bit by bit to the most significant bit. By this arrangement, the carry-bit supplied to a given count-slice from its less significant neighbor may be generated (within gate 459 of each counter slice) in parallel with the count-register output, thus avoiding the accumulated Boolean operation delays that yield the 4-gate (4 timing pulse) critical path in the parallel counter implementation of FIG. 6. More specifically, the critical path within each count slice (i.e., from count register output through one of splitters (S) and XOR gate 461 back to count register input) requires merely two timing pulses—half that required in the parallel counter implementation of FIG. 6. Accordingly, the FCLK ceiling is doubled from ~100 GHz to ~200 GHz (i.e., assuming the same exemplary $t_{stagger}$ and 16× over-clocking factor discussed in reference to FIG. 6), and the data rate is correspondingly doubled from 6.25 Gb/s/link to 12.5 Gb/s/link.

Still referring to FIG. 9, it should be noted that the accumulated ripple delay across the counter is of no consequence to the FCLK and data rate ceilings as canonical operation within the counter (i.e., propagation of logic signals canonically as opposed to being fed back) may simply be pipelined with final output of the counter and/or comparator occurring one or more FCLK cycles after the FCLK cycle that yields a given phase-count output.

FIG. 10 illustrates an exemplary toggle counter 470 in which counter-state feedback is implemented within the counter-state register elements themselves (i.e., the count register within each counter slice $471_0$-$471_{n-1}$ is implemented by a toggle register 473 that changes state in response to each input timing pulse), thus permitting the counter to increment from count to count with virtually no delay save that required for the toggle element to change state. Such embodiments may execute at, near or above terahertz FCLK frequencies. In one toggle-counter embodiment, for example, an 800 GHz FCLK with 16× overclocking yields a 50 Gb/s data rate with 1.25 picosecond phase-adjust resolution.

FIG. 11 illustrates exemplary per-bit count-match circuitry 490 that generates a set of match bits for the toggle counter slices 471 shown in FIG. 10. In the depicted embodiment, each count-match slice $491_0$-$401_{n-1}$ includes a pair of data registers 493, 495 that are loaded with active high and active low (complementary or differential) instances of the count-match bit for the subject counter slice. Complementary instances of the phase-count output by each counter slice are supplied to trigger non-destructive read-outs from the data registers with those read-outs merged at join element 497 to form the match-bit output for the corresponding count slice (i.e., element 471 of FIG. 10). By this arrangement, if the toggle register within a given count slice outputs a logic '1' count bit that matches a corresponding logic '1' count-match bit, data register 493 will deliver a logic '1' output (quantized pulse) that will propagate through join element 497 to the match-bit output. Similarly, if the toggle register within a given count slice outputs a logic '0' count bit (i.e., PhCnt[i]—yields a quantized pulse) that matches a logic '0' count-match value, data register 495 will deliver a logic '1' output (quantized) pulse that will propagate through join element 497 to the match-bit output. If the count bit and match bit do not match, neither of data registers 493, 495 will yield a logic '1' output, with the absence of a quantized pulse output from join element 497 signaling the mismatch result.

Referring to both FIGS. 9 and 10, the logical combination of match bits (i.e., each signaling match or mismatch between a count bit and corresponding count-match bit) to yield the output clock signal may be implemented in a number of different ways. Regarding the ripple counter of FIG. 9, for example, the comparison of each count-match bit with a respective phase-count bit may be time-staggered in accordance with the time-staggered (rippled) generation of the phase count bits themselves, with each match bit being logically ANDed with each subsequently generated match bit to yield, after ANDing with the most-significant match bit, the combined match result and thus the selected clock phase. In the case of the high-speed toggle counter of FIG. 10 and corresponding count-match circuitry of FIG. 11, the individual match bits may be applied as respective, staggered timing pulses to propagate a logic '1' seed value (e.g., chosen from a given counter state) through a high-speed shift register. By that operation, if any of the match bits is a logic '0' the shift-chain will be broken and the shift register output will fail to yield a quantized clock pulse. By contrast, if all match bits are a logic '1', the logic '1' seed value will propagate through the shift register to yield a logic l' output (quantized pulse) each time the toggle counter advances to the count-match specified count value. Various other comparator circuits may be used in alternative embodiments.

FIG. 12 illustrates an exemplary self-timing pulse generator 500 that may be used to generate self-timing pulses (T1, T2, . . . ) in any of the self-timed RSFQ logic circuit embodiments herein. As shown, T1 pulse instances are generated by a splitter 501$i$, with one of those T1 pulses propagating through a wired delay path $503_1$ (which may additionally or alternatively traverse one or more RSFQ buffer elements or other "active" delay elements in alternative embodiments) to yield a delayed T1 instance, T1d. T1d is applied in turn, to trigger output of the T1 pulse captured in register $505_1$ (resetting the register by virtue of the destructive read-out) and thus a timing pulse that yields a number of T2 pulse instances via splitter $501_2$. T3 is generated from a delayed instance of T2 in generally the same way that T2 is generated from the delayed instance of T1 (i.e., T2 propagates through delay line $503_2$ to produce T2d which, in turn, triggers output from register $505_2$ and numerous T3 instances via splitter $501_3$), and T4, T5, etc., are similarly generated respectively from T3, T4, etc., via similar or identical delay lines ($503_3$, $503_4$, etc.) registers ($505_3$, $505_4$, etc.) and splitter elements ($501_4$, $501_5$, etc.). In a number of embodiments, the individual delay lines ($503_1$, $503_2$, etc.) have matched delays and are trimmed/designed to match the input setup time (with engineered margin) of the downstream register. In those embodiments, the pulse-to-pulse timing offset, $t_{stagger}$, is uniform across the asynchronous timing pulse train and cumulatively reflects the delay-line propagation delay ($t_{delay}$), the output delay of the timing-pulse-source register (e.g., $t_{out}$ of register $505_1$ in the case of $t_{stagger}$ between T1 and T2) and the propagation delay through a given splitter element ($t_{split}$). One or more delays may be purposefully made larger than others in alternative embodiments to yield non-uniform $t_{stagger}$ intervals between selected timing pulses.

In the mesochronous embodiments discussed thus far, the RefCK period (or $t_{bit}$) is an integer multiple of the FCLK period—that is, the overclocking factor is an integer value. FIG. 13 illustrates a plesiochronous receive/transmit timing approach that avoids this constraint, permitting FCLK and RefCK to have an arbitrary (including non-integer) and even time-varying frequency ratio. In the particular example shown, the RefCK period is ~80 picoseconds (~12.5 Gb/s/link data rate), while the FCLK period is on the order of ~8.4 picoseconds such that nine FCLK timing pulses are nominally generated during a RefCK period, with a fractional interval of approximately 4.2 picoseconds left over. If both clocks are allowed to run freely, the fractional intervals will accumulate such that approximately once every three RefCK intervals, only eight FCLK timing pulses will be generated. In a number of embodiments, however, FCLK is re-timed (or reset or restarted) in response to each RefCK timing pulse such that a nominally repeating number of FCLK timing events occur per bit time. Note that the integer number of FCLK pulses per $t_{bit}$ interval may yet increase or decrease over macro-time (e.g., milliseconds, seconds or longer) due to temperature/voltage-induced drift in the FCLK-RefCK frequency ratio.

Still referring to FIG. 13, by also resetting (or restarting) an FCLK-triggered phase counter in response to each RefCK timing event, a repeating count of FCLK timing events is generated during each RefCK period, thus providing a repeatable timing index that may be used to extract an FCLK timing pulse having a desired/calibrated phase offset within each $t_{bit}$ interval. In the particular example shown, for example, a count-match value of '5' selects an FCLK pulse having a ~50.5 picosecond phase offset within each $t_{bit}$ interval.

FIG. 14 illustrates an embodiment of a receive clock generator 550 that enables generation of a receive timing signal ($CK_{Rn}$) having a digitally controlled phase offset relative to RefCK despite a plesiochronous relationship between an over-clocked timing reference (FCLK) and RefCK. As with all receive clock generators presented herein, a transmit clock generator may be implemented generally as depicted, receiving $Adj_T$ and $Cal_{Tn}$ signals instead of the receive-calibration control signals shown, and outputting $CK_{Tn}$ and $CySel_{Tn}$ instead of $CK_{Rn}$ and $CySel_{Rn}$.

As with the embodiment of FIG. 5, clock generator 550 includes a phase selector 551 and phase counter 553, with constituents of phase selector 551 including phase-adjust logic 561, clock-select counter 563 and comparator 565. Phase-adjust logic 561 and comparator 565 operate generally as discussed in reference to FIG. 5 (with comparator 565 implemented by any of the variants described above). Clock-select counter 563 also operates generally as discussed in reference to FIG. 5 with the exception that overflow and underflow from the count-match field (i.e., least significant N bits of the clock-select count) occur with an arbitrary modulus established by modulus logic 554 within phase counter 553. For example, in the exemplary FCLK/RefCK frequency ratio shown in FIG. 13, the least significant bits will be counted modulo-9 for most or all RefCK cycles, overflowing from a count value of 9 to a count value of 0 (and incrementing the cycle-select value) and underflowing from a count value of 0 to a count value of 9 (and decrementing the cycle-select value). Modulus logic 554 serves to capture and output this overflow/underflow modulus ('M') to clock-select counter 563, enabling drift-induced increase/decrease in the modulus value over time.

Still referring to FIG. 14, phase counter 553 receives the RefCK signal at a reset input and is thus reset in response to each RefCK timing pulse (i.e., once per $t_{bit}$ interval), an operation that may also shift the top-end phase count (the maximum count reached before reset) into modulus logic 554 to establish the overflow/underflow modulus for clock-select counter 563. RefCK is also supplied to the reset input of a fast-clock generator 555 and, as described in further detail below, serves to re-time (or reset or restart) the FCLK output at the start of each $t_{bit}$ interval (RefCK period) such that each FCLK pulse generated during the $t_{bit}$ interval exhibits a nominally fixed phase offset with respect to the RefCK timing pulse ("nominally fixed" as there may be a relatively slow temperature and/or voltage-induced drift in the phase offset that can be compensated/tracked through periodic timing calibration). As shown, FCLK is supplied to a self-timing pulse generator 557 (e.g., implemented generally as shown in FIG. 12) to yield self-timing pulses to phase counter 553 and comparator 565 as necessary to carry out clock-phase selection for each $t_{bit}$ interval. As discussed above, logic operations within phase counter 553 and/or comparator 565 may be pipelined so that the timing pulse sequence launched by a given FCLK pulse may extend into a subsequent FCLK period and possibly even multiple FCLK periods. Thus, depending on the length of the timing pulse chain generated within the embodiment of FIG. 12 (i.e., number of pulses generated per FCLK pulse), timing pulses may concurrently propagate through two or more of delay lines 503.

Returning to the exemplary plesiochronous FCLK-RefCK timing relationship shown in FIG. 13, it can be seen that an interstitial interval between the final FCLK pulse within a given RefCK period and the initial FCLK pulse of the ensuing RefCK period may be arbitrarily small, tending toward zero in the limiting case. Absent effort to impose a minimum duration, this interstitial interval may be too brief to reset the phase counter and/or FCLK generator in preparation for counting into the new RefCK period. And, while imposing a minimum interstitial duration to avoid such reset-timing pinch is an option in at least one embodiment, such solutions generally impose constraints on the RefCK-FCLK phase relationship.

FIGS. 15, 16, 17 and 18 illustrate embodiments of digital phase adjusters that avoid the reset-timing pinch by providing dual FCLK generators and phase counters and activating an alternate FCLK generator/phase counter pair from one RefCK period to the next. More specifically, as one FCLK generator/phase counter pair is activated to index into a given RefCK period, the other pair is reset and made ready for activation in the immediately ensuing RefCK period. By this operation, the reset operation (of both the FCLK generator and phase counter) is removed from the critical timing path, thus avoiding the reset-timing pinch without constraining the plesiochronous RefCK-FCLK timing relationship.

Referring to the exemplary receive clock generator shown in FIG. 15 and corresponding timing diagram in FIG. 16, a finite state machine 601 (FSM) toggles between even and odd states (StateE and StateO, respectively), transitioning from one to the other in response to each RefCK timing pulse. In the even state, FSM 601 asserts an even-cycle enable signal (en_e) to FCLKe generator 602 to enable even-cycle FCLK generation at a predetermined (and repeatable) time relative to the RefCK pulse that produced the even FSM state. Also while in the even state, FSM 601 asserts an odd-cycle reset signal (rst_o) to odd-cycle phase counter 605 to reset the counter-state therein, thus ensuring that the first odd-state FCLK pulse will yield a zero-valued (or otherwise reset) phase count from the odd-cycle phase counter. As the even-cycle phase counter 604 was similarly reset upon transition from the even state to the odd state, the even-cycle phase counter will, upon FSM entry to the even state, count the FCLKe timing pulses from 0 to maximum throughout the even-state RefCK period—an operation shown in FIG. 15. Thereafter, upon FSM transition to the odd state at the ensuing RefCK pulse, the FSM will deassert en_e and rst_o and instead assert en_o and rst_e, thereby enabling the FCLKo generator 603 and resetting even phase counter 604. Accordingly, as shown in FIG. 15, the odd-cycle phase counter will count the odd-cycle FCLK pulses (i.e., FCLKo pulses) from 0 to maximum, while the even-cycle FCLK generator is idled. This cyclical transition between dual clock generators and phase counters continues at least through the duration of a data burst reception for the receive clock generator shown (or through data burst transmission in the case of a transmit clock generator).

In the embodiment of FIG. 15, the even phase count and odd-phase count values are supplied to respective comparator circuits 608 and 609 for comparison with a count-match value generated by phase selector 610, thus yielding even-cycle and odd-cycle clock pulses that are joined within element 611 to yield the finalized $CK_{Ra}$ output. As shown, the phase counter and comparator pair for a given state (even or odd) may receive self-timing signals from a respective even state/odd-state self-timing pulse generator 606 and 607, with each such pulse generator generating a sequence of time-staggered pulses in response to each pulse of the corresponding fast clock (FCLKe or FCLKo).

FIG. 17 illustrates a more detailed embodiment of a clock generator 625 that may implement the dual receive clock generator of FIG. 16 (and thus any of the receive or transmit clock generators shown in FIG. 1). As shown, clock generator 625 includes a finite state machine 630 (FSM) having a toggle register 635 that transitions alternately between even and odd states (StateE' and StateO') during successive even and odd RefCK periods (cycles) and, for each of the even and odd states, a respective one of: FCLK generators 640 and 641 (generating FCLKe and FCLKo, respectively), self-timing pulse generators 650 and 651, phase counters 664 and 665 and comparators 670 and 671. Upon toggle-register transition to the even state (StateE'), a logic '1' StateE signal from splitter 637 is latched within data register 664 of FCLKe generator 640 and thereafter clocked out of the data register in response to a delayed instance of the RefCK pulse that yielded the state transition. That is, the delayed RefCK instance from delay element 632 (RefCKd) passes through join element 646 and splitter 658 to yield an initial FCLKe pulse. The alternate quantized pulse output of splitter 658 (i.e., replica of the FCLKe pulse) returns to the non-destructive-readout strobe of data register 644 to produce, via non-destructive read-out output Q2, another quantized pulse that also propagates through join element 646 and splitter 648 to emerge as a second FCLKe pulse, with that FCLKe pulse again triggering a non-destructive readout from data register 644 and thus a third FCLKe pulse. By this operation, an ongoing stream of FCLKe pulses is generated at a rate corresponding to the loop delay (i.e., $t_{out}$ delay of data register 644 and propagation delays through join and split elements 646 and 648) until transition of FSM 630 to the odd state. At that point, a StateO signal (from the odd-state counterpart to even-state splitter 637) pulses the destructive read-out strobe (T) of data register 644, thereby clearing the internal state of the data register and thus preventing further FCLKe pulse generation until the FSM reverts to the even state.

Still referring to FIG. 17, the even-cycle fast clock (FCLKe) is supplied to even-cycle self-timing pulse generator 650 which, in turn, generates a self-timing pulse train (T1, T2, T3, . . . Tn) in response to each FCLKe pulse, supplying that pulse train to logic elements within the count slices of even-cycle phase counter 664 and to even-cycle comparator 670. Even-cycle phase counter 664 may be implemented by any of the various phase counter embodiments herein, with modification to enable the counter to be reset at conclusion of the counted RefCK period (i.e., upon transition to the state in which the alternate phase counter takes over). As shown in detail view 669 of an exemplary implementation of count slice 673, a data register 675 and logic AND gate 677 are added to a ripple-count slice otherwise implemented as shown in FIG. 9 to reset count-state register 453 in preparation for counting anew during a subsequent RefCK period. Additional self-timing pulses may be generated as necessary (i.e., after the even state terminates) to clear the content of register 453 and thus zero (or otherwise pre-set) the even-cycle phase counter in preparation for the next even-cycle counting sequence. More generally, various alternative reset logic arrangements may be implemented in alternative embodiments (i.e., any circuit arrangement that clears or otherwise establishes a predetermined counter state such that counting is re-started upon return to the subject FSM state). Parallel-count slices and toggle-count slices as shown in FIGS. 6 and 10, respectively, may also be supplemented with reset logic.

Still referring to FIG. 17, odd-state clock generator, self-timing pulse generator and phase counter operate identically as described with respect to their even-state counterparts, but during odd RefCK cycles. Accordingly, phase counts from the even-cycle and odd-cycle phase counters 664 and 665 are supplied to the even-cycle and odd-cycle comparators 670 and 671, respectively, to enable selection (extraction) of even-cycle and odd-cycle receive clock pulses, $CK_{Re}$ and $CK_{Ro}$. In the embodiment shown, those clock pulses are joined within join element 675 to yield the completed (composited) receive clock, $CK_{Rn}$.

FIG. 18 illustrates an exemplary timing diagram corresponding to FIG. 17. As shown, the even-cycle fast clock (FCLKe) and odd-cycle fast clock (FCLKo) are alternately enabled along with respective even-cycle and odd-cycle phase counters to count into respective RefCK periods. The phase counter and comparator circuitry yield a selected even-cycle and odd-cycle output clock pulse—one pulse per RefCK period with a match-count selected phase offset—that are joined to yield the finalized output clock.

FIGS. 19 and 20 correspond to an alternative receive/transmit timing adjustment technique that lack encoded phase counters and (in at least one embodiment) phase count comparators. As shown, a recirculating shift register 703 (or ring buffer) iteratively rotates 1-hot pattern data (i.e., only one of the N pattern data bits is a logic '1') such that a single quantized pulse is output from the shift register once per every N bit-shift operations. In the depicted embodiment, FCLK is supplied to shift the data pattern incrementally through the ring buffer (with FCLK propagating through a daisy-chained set of splitter elements $701_0$-$701_{15}$ to stagger the timing pulses supplied to the individual RSFQ register elements $705_0$-$705_{15}$ that constitute the ring buffer). As N=16 in the example shown, one out of every 16 FCLK pulses yields a quantized pulse at the receive clock output (i.e., from splitter 707, which also provides a feedback output to close the recirculation ring).

Still referring to FIGS. 19 and 20, the phasing of the receive clock with respect to a given frame of FCLK pulses (i.e., FCLK pulses framed by a given RefCK period) may be controlled by the initial position of the 1-hot bit (the solitary logic '1' bit) within the pattern data. In the particular embodiment shown, a load multiplexer 709 is provided to enable a new data pattern to be shifted into the ring buffer (overwriting the old) and thus establish the 1-hot bit at any of sixteen phase offsets within a given RefCK period. FIG. 10 illustrates an exemplary timing diagram corresponding to operation of the phase adjuster of FIG. 19, showing a one-hot pattern that establishes the fifth FCLK pulse (i.e., pulse number '4', starting from 0) within each RefCK period as the desired receive clock phase. Note that, while no count comparator circuitry is implemented within the embodiment of FIG. 19, the N different possible 1-hot states of the ring buffer may be viewed as implementing a fully decoded counter (i.e., decoded count states instead of encoded count states). Accordingly, instead of establishing a desired receive clock phase through pattern data alignment with the RefCK frame, the decoded output could be compared with a decoded count-match value, or the decoded output could be encoded and compared with an encoded count-match value. In either embodiment, as the critical timing path in the counter-state transition is limited to the speed at which data may be shifted between any two registers 705 in within shift register 703, extremely high FCLK frequencies may be employed, approaching or surpassing terahertz frequencies as in the toggle-counter implementation discussed above. As each change in the count-state ripples through the register elements, a correspondingly pipelined compare operation may be used to extract the desired receive clock phase.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, pixel array sizes, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated circuit device having a signaling interface, the method comprising:
   generating a sequence of timing pulses;
   generating a data-rate clock having a single clock pulse for every N pulses in the sequence of timing pulses, where N is an integer greater than four; and
   sampling a data signal at the signaling interface in response to consecutive pulses of the data-rate clock to produce respective single-bit digital samples corresponding to consecutive digital bits conveyed in the data signal.

2. The method of claim 1 wherein generating the data-rate clock having the single clock pulse for every N pulses within the sequence of timing pulses comprises generating a respective pulse in the data-rate clock in response to every Nth pulse in the sequence of timing pulses.

3. The method of claim 2 further comprising, after generating an $n^{th}$ clock pulse within the data-rate clock signal in response to an $m^{th}$ pulse in the sequence of timing pulses, adjusting a phase of the data-rate clock signal by generating an $(n+1)^{th}$ pulse in the data-rate clock signal in response to either an $(m+N+1)^{th}$ pulse in the sequence of timing pulses or an $(m+N-1)^{th}$ pulse in the sequence of timing pulses.

4. The method of claim 3 further comprising, after adjusting the phase of the data-rate clock signal, generating respective pulses in the data-rate clock signal after every N pulses in the sequence of timing pulses.

5. The method of claim 1 where N≥10.

6. The method of claim 1 wherein the digital bits are conveyed in the data signal at a first data rate, and wherein generating the sequence of timing pulses comprises generating a timing signal that cycles at an integer multiple of the first data rate.

7. The method of claim 1 wherein the digital bits are conveyed in the data signal at a first data rate, and wherein generating the sequence of timing pulses comprises generating a timing signal that cycles at a non-integer multiple of the first data rate.

8. The method of claim 1 wherein generating the data-rate clock having a single clock pulse for every N pulses in the sequence of timing pulses comprises counting the sequence of timing pulses in a modulo-N counter and generating a respective clock pulse within the data-rate clock in response to each transition of the module-N counter to a selected count value between 0 and N−1.

9. The method of claim 8 further comprising adjusting a phase of the data-rate clock by incrementing or decrementing the selected count value.

10. The method of claim 8 further comprising:
generating a phase-detect clock that is phase-shifted relative to the data-rate clock signal by half a period of the data-rate clock signal;
sampling the data signal in response to respective transitions of the phase-detect clock to produce phase-detect samples; and
adjusting a phase of the data-rate clock by incrementing or decrementing the selected count value based on the phase-detect samples.

11. An integrated circuit device comprising:
a signaling interface to receive a data signal;
clock generating circuitry to generate (i) a sequence of timing pulses and (ii) a data-rate clock having a single clock pulse for every N pulses in the sequence of timing pulses, where N is an integer greater than four; and
sampling circuitry to sample the data signal at the signaling interface in response to consecutive pulses of the data-rate clock to produce respective single-bit digital samples corresponding to consecutive digital bits conveyed in the data signal.

12. The integrated circuit device of claim 11 the clock generating circuitry to generate the data-rate clock having the single clock pulse for every N pulses within the sequence of timing pulses comprises circuitry to generate a respective pulse in the data-rate clock in response to every Nth pulse in the sequence of timing pulses.

13. The integrated circuit device of claim 12 wherein, after generating an $n^{th}$ clock pulse within the data-rate clock signal in response to an $m^{th}$ pulse in the sequence of timing pulses, the clock generating circuitry adjusts a phase of the data-rate clock signal by generating an $(n+1)^{th}$ pulse in the data-rate clock signal in response to either an $(m+N+1)^{th}$ pulse in the sequence of timing pulses or an $(m+N−1)^{th}$ pulse in the sequence of timing pulses.

14. The integrated circuit device of claim 13 wherein, after adjusting the phase of the data-rate clock signal, the clock generating circuitry generates respective pulses in the data-rate clock signal after every N pulses in the sequence of timing pulses.

15. The integrated circuit device of claim 11 wherein the digital bits are conveyed in the data signal at a first data rate, and wherein the clock generating circuitry to generate the sequence of timing pulses comprises circuitry to generate a timing signal that cycles at an integer multiple of the first data rate.

16. The integrated circuit device of claim 11 wherein the digital bits are conveyed in the data signal at a first data rate, and wherein the clock generating circuitry to generate the sequence of timing pulses comprises circuitry to generate a timing signal that cycles at a non-integer multiple of the first data rate.

17. The integrated circuit device of claim 11 wherein the clock generating circuitry to generate the data-rate clock having a single clock pulse for every N pulses in the sequence of timing pulses comprises circuitry to generate a modulo-N count of pulses within the sequence of timing pulses and to generate a respective clock pulse within the data-rate clock in response to each transition of the modulo-N count to a selected count value between 0 and N−1.

18. The integrated circuit device of claim 11 wherein the clock generating circuitry to generate the data-rate clock having a single clock pulse for every N pulses in the sequence of timing pulses further comprises circuitry to adjust a phase of the data-rate clock by incrementing or decrementing the selected count value.

19. The integrated circuit device of claim 18 wherein the clock generating circuitry to generate the data-rate clock having a single clock pulse for every N pulses in the sequence of timing pulses further comprises circuitry to:
generate a phase-detect clock that is phase-shifted relative to the data-rate clock signal by half a period of the data-rate clock signal;
sample the data signal in response to respective transitions of the phase-detect clock to produce phase-detect samples; and
adjust a phase of the data-rate clock by incrementing or decrementing the selected count value based on the phase-detect samples.

20. An integrated circuit device comprising:
a signaling interface to receive a data signal;
means for generating a sequence of timing pulses;
means for generating a data-rate clock having a single clock pulse for every N pulses in the sequence of timing pulses, where N is an integer greater than four; and
means for sampling the data signal at the signaling interface in response to consecutive pulses of the data-rate clock to produce respective single-bit digital samples corresponding to consecutive digital bits conveyed in the data signal.

* * * * *